(12) United States Patent
Vinciarelli

(10) Patent No.: US 7,187,263 B2
(45) Date of Patent: Mar. 6, 2007

(54) PRINTED CIRCUIT TRANSFORMER

(75) Inventor: Patrizio Vinciarelli, Boston, MA (US)

(73) Assignee: VLT, Inc., Sunnyvale, CA (US)

( * ) Notice: Subject to any disclaimer, the term of this patent is extended or adjusted under 35 U.S.C. 154(b) by 365 days.

(21) Appl. No.: 10/723,768

(22) Filed: Nov. 26, 2003

(65) Prior Publication Data

US 2005/0110606 A1    May 26, 2005

(51) Int. Cl.
*H01F 5/00* (2006.01)
(52) U.S. Cl. ...................................... 336/200
(58) Field of Classification Search ............ 336/65, 336/83, 200–208, 232; 361/760–766
See application file for complete search history.

(56) References Cited

U.S. PATENT DOCUMENTS

| 2,943,966 A | 7/1960 | Leno |
| 3,323,091 A | 5/1967 | Hibbits |

(Continued)

FOREIGN PATENT DOCUMENTS

| AU | 4003897 | 3/1998 |
| DE | 10009078 | 9/2001 |
| EP | 1333553 | 8/2003 |

OTHER PUBLICATIONS

U.S. Appl. No. 10/066,418, filed Jan. 31, 2002 Factorized Power Architecture With Point of Load Sine Amplitude Converters.
Ngo et al., "Development and Characterization of a Low-Profile Matrix Transformer", HFPC, May 1990 Proceedings.

(Continued)

*Primary Examiner*—Tuyen Nguyen
(74) *Attorney, Agent, or Firm*—Fish & Richardson P.C.

(57) ABSTRACT

A circuit board has apertures. Separate magnetic flux paths each form a closed loop that passes through at least one of the apertures and surrounds an interior space. The flux paths comprising portions that lie within magnetically permeable core pieces. At least two of the flux paths are oriented so that there is a straight line in the circuit board that passes through the interior spaces of the two flux paths without passing through any of the apertures that are included in the paths. An electrically conductive primary winding having a first segment that passes through the interior spaces of the permeable paths and a second segment located outside of the interior spaces. There are two or more electrically conductive secondary windings.

21 Claims, 22 Drawing Sheets

U.S. PATENT DOCUMENTS

| | | | |
|---|---|---|---|
| 3,477,016 | A | 11/1969 | Papaleonidas |
| 4,665,357 | A | 5/1987 | Herbert |
| 4,959,630 | A | 9/1990 | Yerman et al. |
| 5,017,902 | A | 5/1991 | Yerman et al. |
| 5,300,911 | A * | 4/1994 | Walters ............... 336/175 |
| 5,381,124 | A | 1/1995 | Roshen |
| 5,631,822 | A * | 5/1997 | Silberkleit et al. ......... 363/144 |
| 6,005,773 | A * | 12/1999 | Rozman et al. ............ 361/707 |
| 6,940,384 | B2 * | 9/2005 | Hooey et al. ............... 336/200 |
| 6,980,074 | B1 * | 12/2005 | Jitaru ........................ 336/200 |
| 2003/0142513 | A1 | 7/2003 | Vinciarelli |

OTHER PUBLICATIONS

Ngo et al., "Modeling of Mangetizing Inductance and Leakage Inductance in a Matrix Transformer", IEEE Trjansactions on Power Electronics, vol. 8, No. 2, Apr. 1993.

Ngo et al., "Modeling of Losses in a Sandwiched-Winding Matrix Transformer", IEEE Transactions on Power Electronics, vol. 10, No. 4, Jul. 1995.

Kaiwei Yao et al., "A novel winding coupled-buck converter for high-frequency, high step-down DC/DC conversion" Annual Power Electronics Specialists Conference, New York, NY: IEEE, US. vol. 2 of 4, Conf. 33, Jun. 23, 2002, pp. 651-656.

* cited by examiner

PRINTED CIRCUIT TRANSFORMER

BACKGROUND

This description relates to printed circuit transformers.

A DC-to-DC transformer apparatus, called a Sine Amplitude Converter ("SAC"), is described in U.S. patent application Ser. No. 10/066,418, filed Jan. 31, 2002, and U.S. patent application Ser. No. 10/264,327, filed Oct. 1, 2002 (the "Factorized Applications", incorporated in their entirety by reference). One embodiment of a SAC, shown in FIG. 1, comprises a series-resonant full-bridge converter operated at a fixed frequency slightly below a characteristic resonant frequency of the converter to provide for switching at times of zero-voltage and zero-current.

Some embodiments of the SAC operate in a "low-Q" configuration, where the "quality factor," Q, of a series resonant converter operating at resonance is defined in the Factorized Applications, as $Q=Z_L/R_{eq}$, where $Z_L=2\pi*f_R*L_R$ is the total inductive impedance of the resonant circuit at the resonant frequency, $f_R$; where the inductance $L_R$ includes all discrete, leakage and circuit parasitic inductances, reflected into the transformer primary and in series with the resonant circuit; and where $R_{eq}$ is the total equivalent series resistance of the circuit, reflected to the transformer primary and including, resistances of windings, ON-state resistances of switches, rectifiers and resonant capacitors.

A SAC uses principles of resonant charge transfer so the quality factor, Q, does not directly reflect cycle-by-cycle losses in a SAC. Rather, the losses in the resonant tank of a SAC are proportional to the equivalent series resistance $R_{eq}$. In some SACs, the equivalent series resistance $R_{eq}$ is minimized and the transformer is designed to minimize leakage inductance. Use of a low-Q resonant circuit generally provides higher bandwidth and shorter transient response time, together with greater inherent stability.

Herbert, U.S. Pat. No. 4,665,357, "Flat Matrix Transformer" describes a "matrix transformer" that has interdependent magnetic circuits, arranged in a matrix, between and among which electrical conductors are interwired, the circuits and conductors cooperating to behave as a transformer. Matrix transformers generally have magnetically decoupled magnetic cores, each having one or more coupled windings, the windings on different cores being interconnected to form the transformer structure. See, for example, Hibbits, U.S. Pat. No. 3,323,091, "Multicore Transformer Including Integral Mounting Assembly"; in Papaleonidas, U.S. Pat. No. 3,477,016, "Transformer System Including a Large Number of Magnetically Independent Transformer Elements"; and in three papers by Ngo, Alpizar and Watson: "Development and Characterization of a Low-Profile Matrix Transformer", HFPC May 1990 Proceedings; "Modeling of Magnetizing Inductance and Leakage Inductance in a Matrix Transformer", IEEE Transactions on Power Electronics, Vol. 8, No. 2, April 1993; "Modeling of Losses in a Sandwiched-Winding Matrix Transformer", IEEE Transactions on Power Electronics, Vol. 10, No. 4, July 1995.

FIG. 2 shows an exploded perspective view of a portion of a matrix transformer having a serpentine winding that includes a pair of conductive patterns 10a, 10b (e.g., copper etch) on surfaces of one or more substrates 12a, 12b (e.g., printed circuit boards ("PCBs")). Current enters conductive pattern 10b at the location marked "A" and exits conductive pattern 10a at the location marked "B." The conductive patterns 10a, 10b are connected in series by, e.g., conductive interconnections, not shown. The patterns carry a current in the direction indicated in the Figure by the arrows. Magnetic core pieces 16a–16c, 17a–17c pass through holes 14a–14f, 15a–15f in the substrates 12a, 12b so that opposing pairs of core pieces (e.g., core pieces 16a and 17a) form an essentially closed permeable flux path. The term "flux path", as used herein, refers to the principal path followed by the flux that links a pair of transformer windings, as distinguished from minor flux paths, such as those associated with, e.g., leakage flux or fringing fields). In the apparatus of FIG. 2, each flux path formed by each core pair is coupled by two turns formed by the conductive patterns 10a, 10b and each core pair creates a magnetic flux path that is essentially independent of the magnetic flux path formed by the other core pairs.

Matrix transformers comprising serpentine windings are described in the three papers by Ngo, Alpizar and Watson, ibid; in Leno, U.S. Pat. No. 2,943,966, "Printed Electrical Circuits"; in Yerman et al, U.S. Pat. No. 4,959,630, "High-Frequency Transformer" and U.S. Pat. No. 5,017,902, "Conductive Film Magnetic Components"; and in Roshen, U.S. Pat. No. 5,381,124, "Multi-Turn Z-Foldable Secondary Winding for a Low-Profile Conductive Film Transformer."

Walters, U.S. Pat. No. 5,300,911, "Monolithic Magnetic Device With Printed-Circuit Interconnections" describes a monolithic magnetic device having transformer elements having single turn primaries and single turn secondaries fabricated on a plate of ferrite which has the outline of a ceramic leadless chip carrier. Each of the magnetic elements has a primary winding formed from a copper via plated on the ferrite. Each element's secondary is another copper via plated over an insulating layer formed over the first layer of copper. The elements' primaries are interconnected on the first copper layer and the elements' secondaries are interconnected on the second copper layer. The configuration and turns ratio of the transformer are determined by the series and or parallel interconnections of the primary and secondaries.

SUMMARY

In general, in one aspect, the invention features an apparatus comprising: a circuit board having apertures; separate magnetic flux paths each forming a closed loop that passes through at least one of the apertures and surrounds an interior space, the flux paths comprising portions that lie within magnetically permeable core pieces, at least two of the flux paths being oriented so that there is a straight line in the circuit board that passes through the interior spaces of the two flux paths without passing through any of the apertures that are included in the paths, an electrically conductive primary winding having a first segment that passes through the interior spaces of the permeable paths and a second segment located outside of the interior spaces; and two or more electrically conductive secondary windings.

Implementations of the invention include one or more of the following features. The two flux paths are adjacent on the board. The primary winding comprises a loop. The loop comprises two longer parallel straight segments and two shorter bridging segments that connect the two longer parallel straight segments. At least one of the secondary windings is on a second layer of the circuit board. Each of the secondary windings comprises a first segment that passes through fewer interior spaces than does the primary winding. Each of the secondary windings comprises a first segment that overlays a first segment of the primary winding and a second segment that overlays a second segment of the primary winding. The flux path comprises no gaps between permeable core pieces. The flux path comprises gaps between permeable core pieces. The magnetically permeable core pieces include flat pieces and pieces with legs. At least two of the secondary windings are connected in parallel. The connections to the primary winding are made along an edge of the circuit board that is on a different side of the apparatus from an edge along which connections are made to at least one of the secondary windings. The core pieces include flat pieces and pieces that each have one leg on one side of an interior space and two legs on another side of the interior space. The secondary windings are connected to form a single center-tapped winding. The secondary windings lie on two different layers of the board. The secondary windings are configured to produce different turns ratios.

In general, in another aspect, the invention features an apparatus comprising: a circuit board having apertures; separate magnetic flux paths each forming a closed loop that passes through at least one of the apertures and surrounds an interior space, the flux paths comprising portions that lie within magnetically permeable core pieces, at least two adjacent ones of the flux paths being oriented so that there is a straight line in the circuit board that passes through the interior spaces of the two flux paths without passing through any of the apertures that are included in the paths, an electrically conductive primary winding in the form of a loop having a first segment that passes through the interior spaces of the permeable paths and a second segment located outside of the interior spaces; and two or more electrically conductive secondary windings on at least a second layer of the circuit board, each of the secondary windings comprising a first segment that passes through fewer interior spaces than does the primary winding, each of the secondary windings comprises a first segment that overlays a first segment of the primary winding and a second segment that overlays a second segment of the primary winding, at least two of the secondary windings connected in parallel, connections to the primary winding being made along an edge of the circuit board that is on a different side of the apparatus from an edge along which connections are made to at least one of the secondary windings.

Implementations of the invention may include one or more of the following features. The secondary windings are connected to form a single center-tapped winding. The secondary windings lie on two different layers of the board. The secondary windings are configured to produce different turns ratios.

In general, in another aspect, the invention features a circuit comprising: electrical elements forming a series-resonant full-bridge converter, the elements including a transformer comprising a circuit board having apertures; separate magnetic flux paths each forming a closed loop that passes through at least one of the apertures and surrounds an interior space, the flux paths comprising portions that lie within magnetically permeable core pieces, at least two of the flux paths being oriented so that there is a straight line in the circuit board that passes through the interior spaces of the two flux paths without passing through any of the apertures that are included in the paths, an electrically conductive primary winding having a first segment that passes through the interior spaces of the permeable paths and a second segment located outside of the interior spaces; and two or more electrically conductive secondary windings.

Other advantages and features of the invention will become apparent from the following description and from the claims.

DESCRIPTION

We first briefly describe the drawings.

Figure 3:
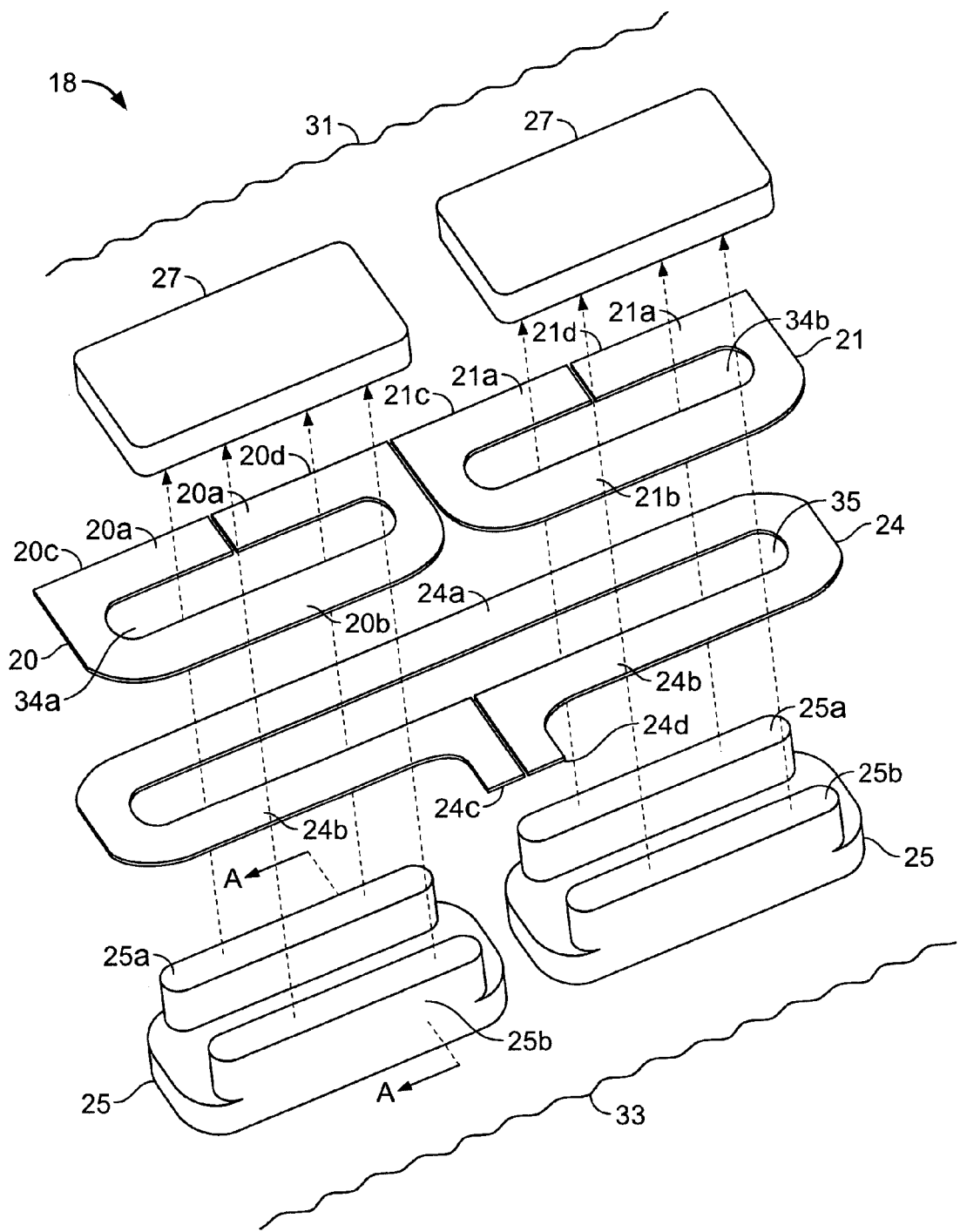
FIG. 3 shows an exploded view of a transformer.
Figure 4:
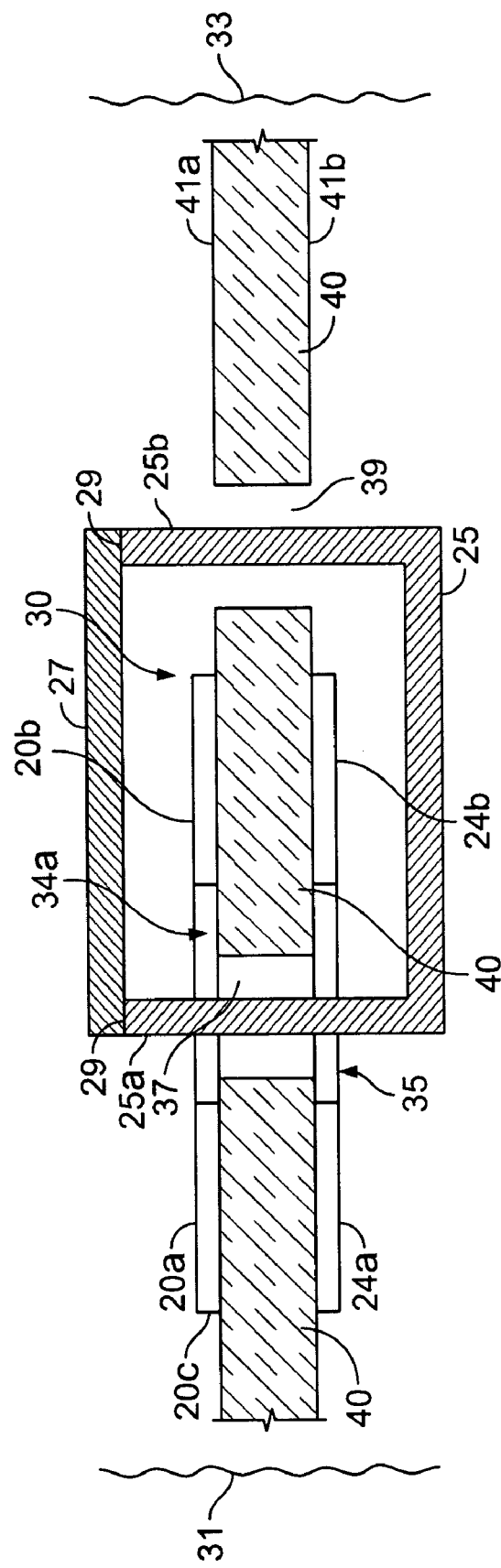
FIG. 4 shows a sectional side view of the transformer of FIG. 3.

FIG. 3 shows an exploded view of a example transformer 18. The transformer comprises secondary windings 20, 21, a primary winding 24, and two pairs of permeable first and second magnetic core pieces 25, 27, respectively. FIG. 4 shows a sectional side view (through the section labeled AA in FIG. 3) of the constructed transformer. The windings 20, 21, 24 may be etch patterns on surfaces of a printed circuit board ("PCB") and the windings 20 and 21 may be separated from the winding 24 by non-conductive substrate material 40 (FIG. 4). For clarity, the non-conductive substrate 40 is not shown in FIG. 3.

Referring to FIGS. 3 and 4, each pair of top and bottom core pieces 25 and 27 defines a closed magnetic flux path that surrounds a single interior space 30 (FIG. 4). The closed magnetic flux path may (but need not) include a gap (e.g., at locations 29, FIG. 4). A portion of the primary winding (i.e., portion 24a) and a portion of each of the secondary windings (i.e., portions 20b, 21b) are located within the interior space 30. Legs 25a of core pieces 25 pass through apertures 34a, 34b, 35 formed by the windings and through apertures 37 in the non-conductive substrate 40 (one aperture is shown in FIG. 4). A portion of the primary winding 24a and portions of the secondary windings 20a, 21a are located outside of the interior space 30. The conductive primary winding terminations 24c, 24d and the conductive secondary winding terminations 20c, 20d, 21c, 21d are located on opposite sides of the transformer. The conductive primary winding terminations 24c, 24d are brought out of the transformer 18 in a "primary region" 33 (in FIG. 4, the region to the right of core legs 25b; the terminations 24c and 24d are located on surfaces 41b of non-conductive substrate 40, but do not appear in FIG. 4 owing to the location of section AA), whereas the conductive secondary winding terminations 20c, 20d, 21c, 21d are brought out of the transformer in a "secondary region" 33 (in FIG. 4, the region to the left of core legs 25a). The windings are located to overlap, both in the interior spaces 30 between the core legs 25a, 25b and in the region adjacent to core leg 25a, outside of interior region 30, in secondary region 31.

Figure 5:
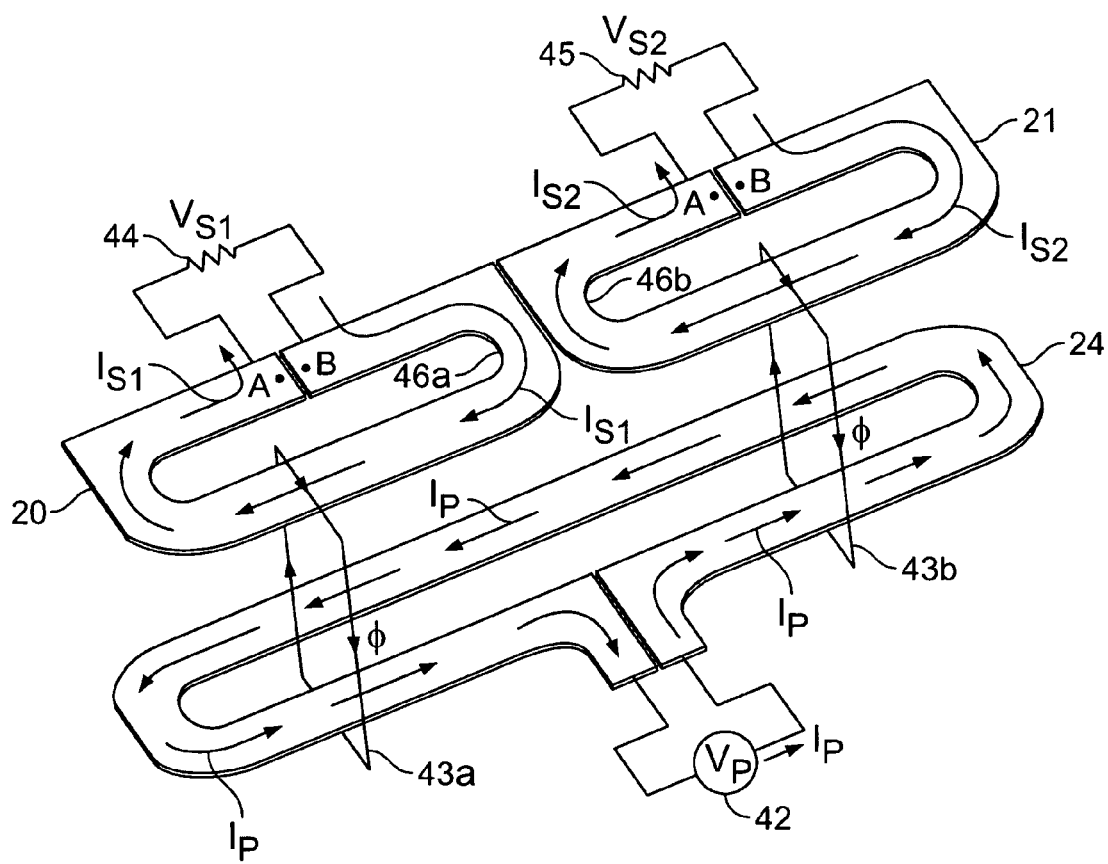
FIG. 5 shows an exploded schematic view of current flows in the transformer of FIG. 3.

FIG. 5 is a schematic view of the transformer of FIGS. 3 and 4. As shown in the Figure, a time varying voltage source, Vp 42, connected to the primary winding 24 induces a time-varying flux in the core pieces, as illustrated schematically in FIG. 5 by flux paths 43a, 43b (for clarity, the core pieces 25, 27 are not shown). The time varying flux induces voltages in the two secondary windings 20, 21. Because each secondary winding is linked by half of the total primary flux, the voltage induced in each secondary winding, Vs1 and Vs2, will be half of the primary voltage, Vp. Secondary currents, Is1 and Is2, will flow in each of the secondary windings 20, 21, the value of each secondary current depending on the size of the load 44, 45 connected to the winding.

Of particular interest is the case in which the secondary windings are connected in parallel. In FIG. 5, this would correspond to secondary winding ends marked "A" being connected together and secondary winding ends marked "B" being connected together. In this case, the voltage Vs1=Vs2 across each secondary winding will equal Vp/2; the total current in the secondaries, Is1+Is2 will equal 2*Ip; and each of the currents, Is1 and Is2, will be equal to Ip. Given that the primary and secondary windings physically overlap each other along almost their entire lengths (except for the short sections 46a and 46b of the secondary windings that do not overlap the primary winding) and provide "eddy current" shielding, and that the overlapping currents flowing in the primary and secondary windings are equal and flow in opposite directions, the amount of leakage flux generated by the transformer will be very small. Thus, the transformer will have relatively low leakage inductance.

Figure 1:
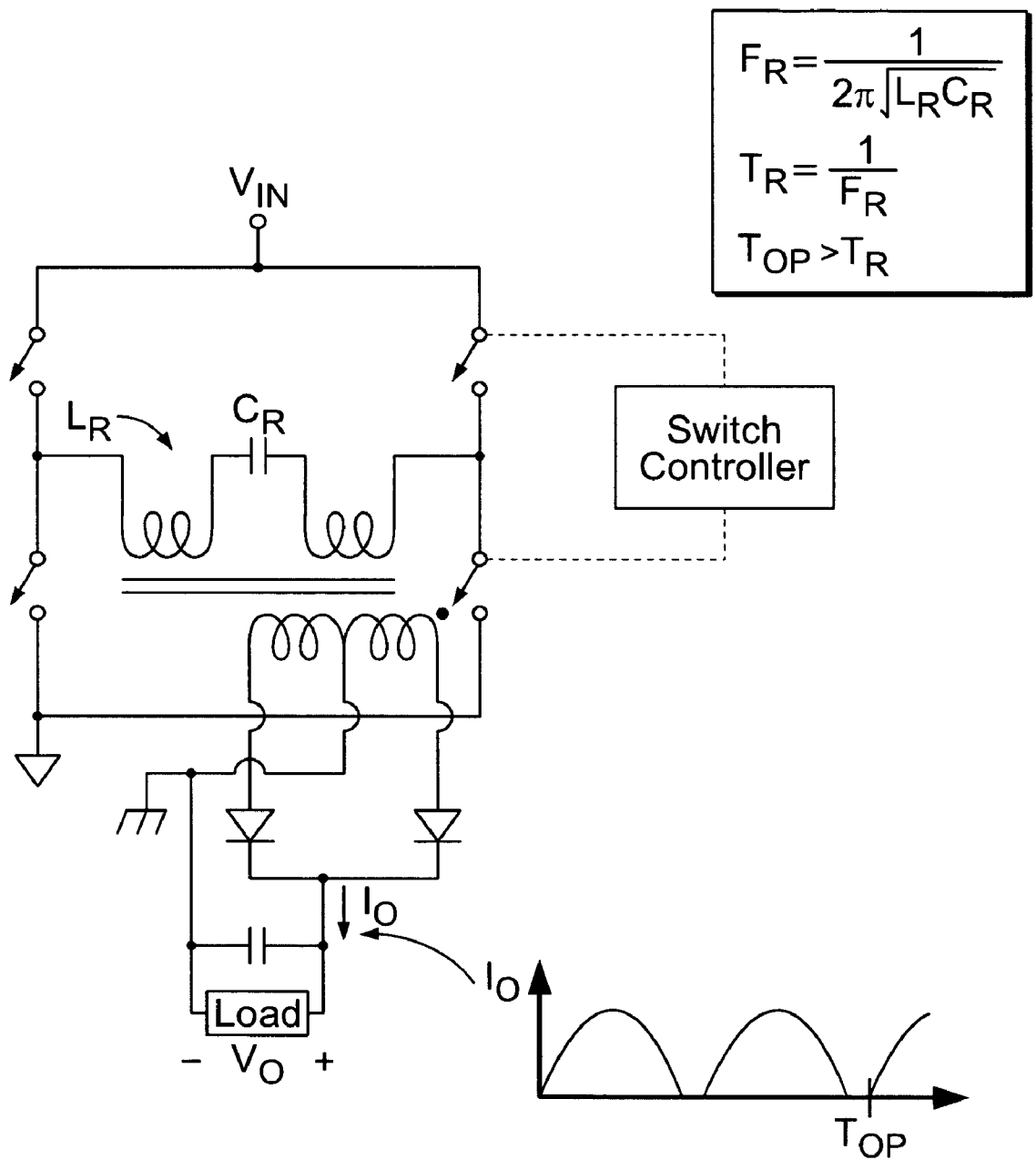
FIG. 1 shows a schematic of a sine amplitude converter.
Figure 2:
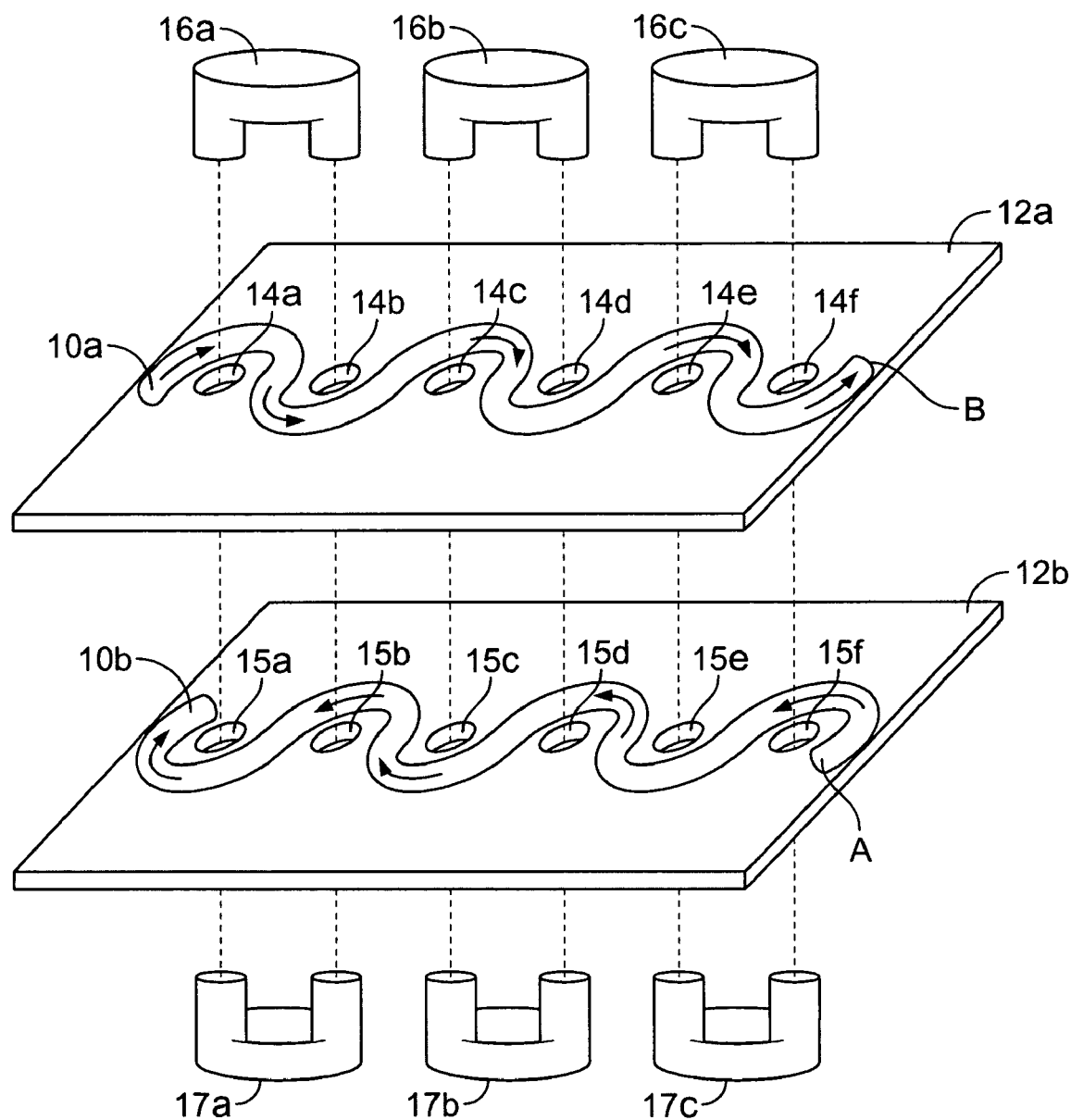
FIG. 2 shows a portion of a transformer.

Another feature of the transformer 18 is that the interior spaces (30, FIG. 4) of adjacent magnetic flux paths are aligned with each other so that the windings 20, 21, 24 can be routed straight through the interior spaces of the adjacent magnetic paths. Said another way, the interior spaces of each adjacent pair of magnetic flux paths are aligned so that a straight line may be drawn that will pass through the interior spaces without intersecting any portion of either magnetic flux path. This is in contrast to the serpentine transformer structure of FIG. 2, in which the alignment of the interior spaces of adjacent flux paths (e.g., in FIG. 2, the interior spaces defined by core pairs 16a, 17a and 16b, 17b) is such that a straight line cannot be drawn that passes through the adjacent interior spaces without intersecting one of the magnetic flux paths. In the latter case, the winding is made serpentine so that it can pass through the interior spaces defined by the plurality of core sets. As a result, for a given transformer surface area, the windings of a transformer may be made shorter and wider than those in a serpentine transformer, and the winding resistance in a transformer will be lower.

The combination of low leakage inductance and low resistance of a transformer provides the "low-Q" characteristic that is desirable in transformers used in contemporary high-frequency power converters, such as, e.g., the SAC converters.

Figure 6:
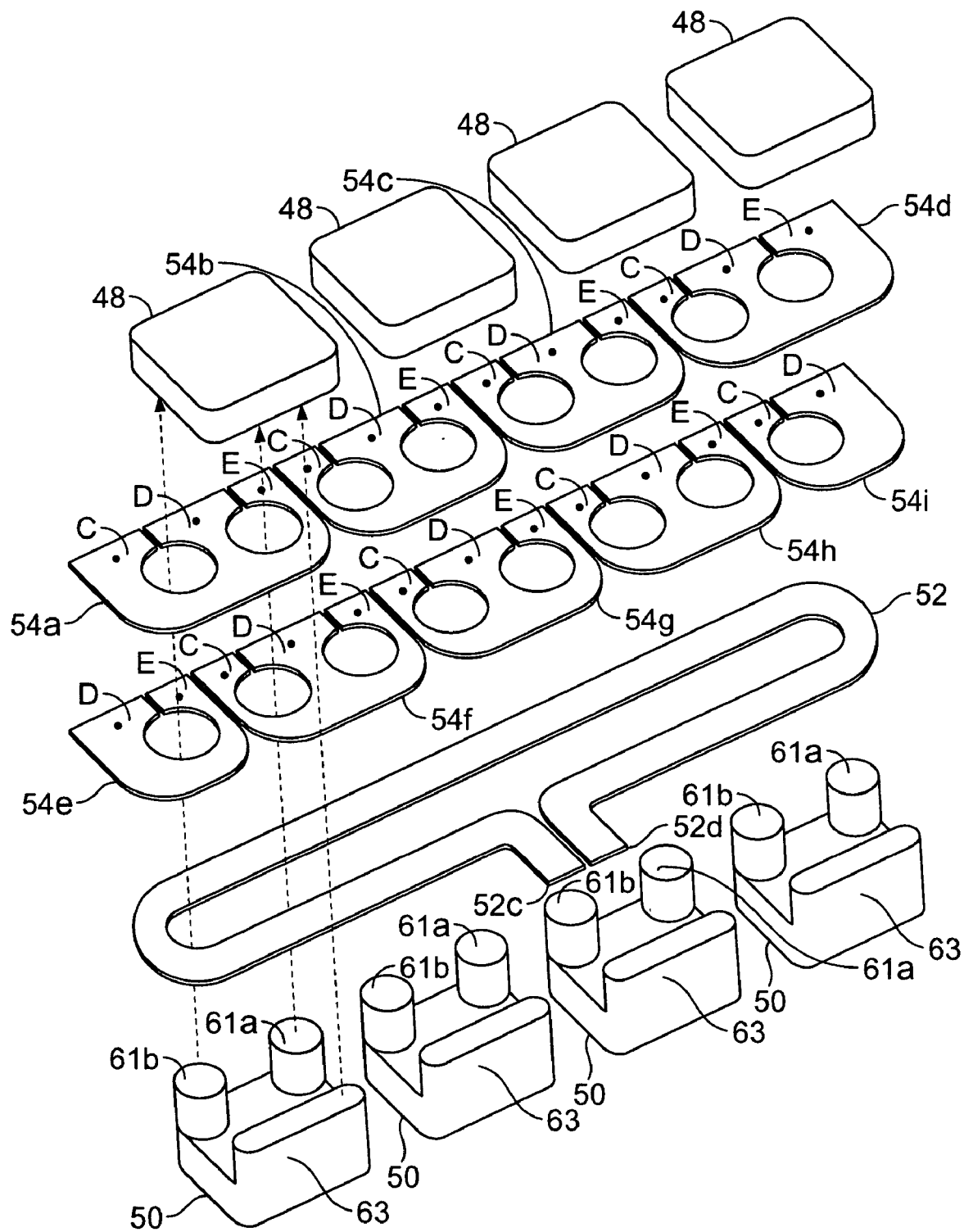
FIG. 6 shows an exploded view of another transformer.
Figure 7:
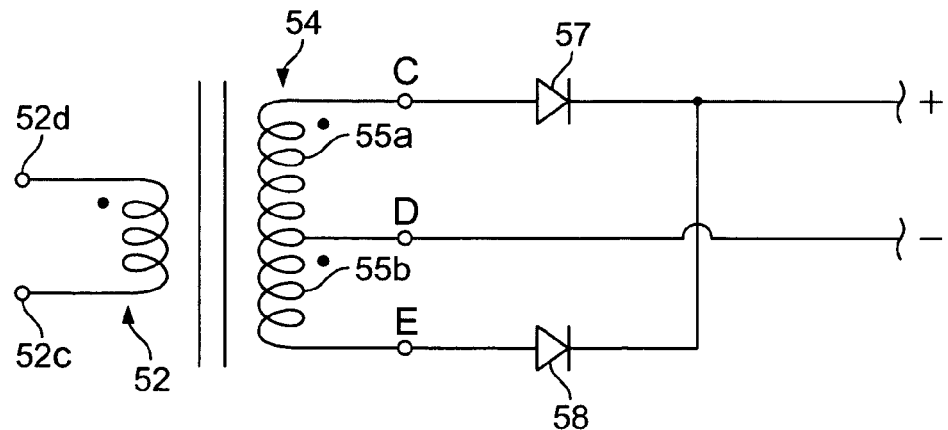
FIG. 7 shows a schematic of a circuit for the transformer of FIG. 6.

Using the approach explained by example above, a transformer may be readily scaled to accommodate a wide variety of turns ratios and applications while retaining its desirable features. For example, FIG. 6 shows an exploded view of a transformer comprising four sets of core pairs, each pair comprising a top core piece 48 and a bottom core piece 50, each bottom core piece 50 comprising two narrow legs 61a, 61b and a wide leg 63; a primary winding 52; and a total of nine secondary windings 54a–54i. The windings 52, 54a–54i may be etch patterns on surfaces of a PCB and may be separated from each other by non-conductive substrate material (not shown). In the example shown, the secondary windings may be connected to form a single, center-tapped, winding, as illustrated in FIG. 7, by connecting all of the points marked "C" (FIG. 6); all of the points marked "D" (FIG. 6); and all of the points marked "E" (FIG. 6) (e.g., by use of plated vias and etch, not shown, on the PCB). Connected in this way, the turns ratio between the primary winding 52 and each half 55a, 55b (FIG. 7) of the center-tapped secondary winding will be 8:1 and the turns ratio between the primary winding and the entire secondary winding 54, comprising the two halves 55a, 55b of the winding connected in series, will be 4:1. Owing to the relative locations of the windings, the transformer in FIG. 7 exhibits a very low value of leakage inductance.

Figure 8:
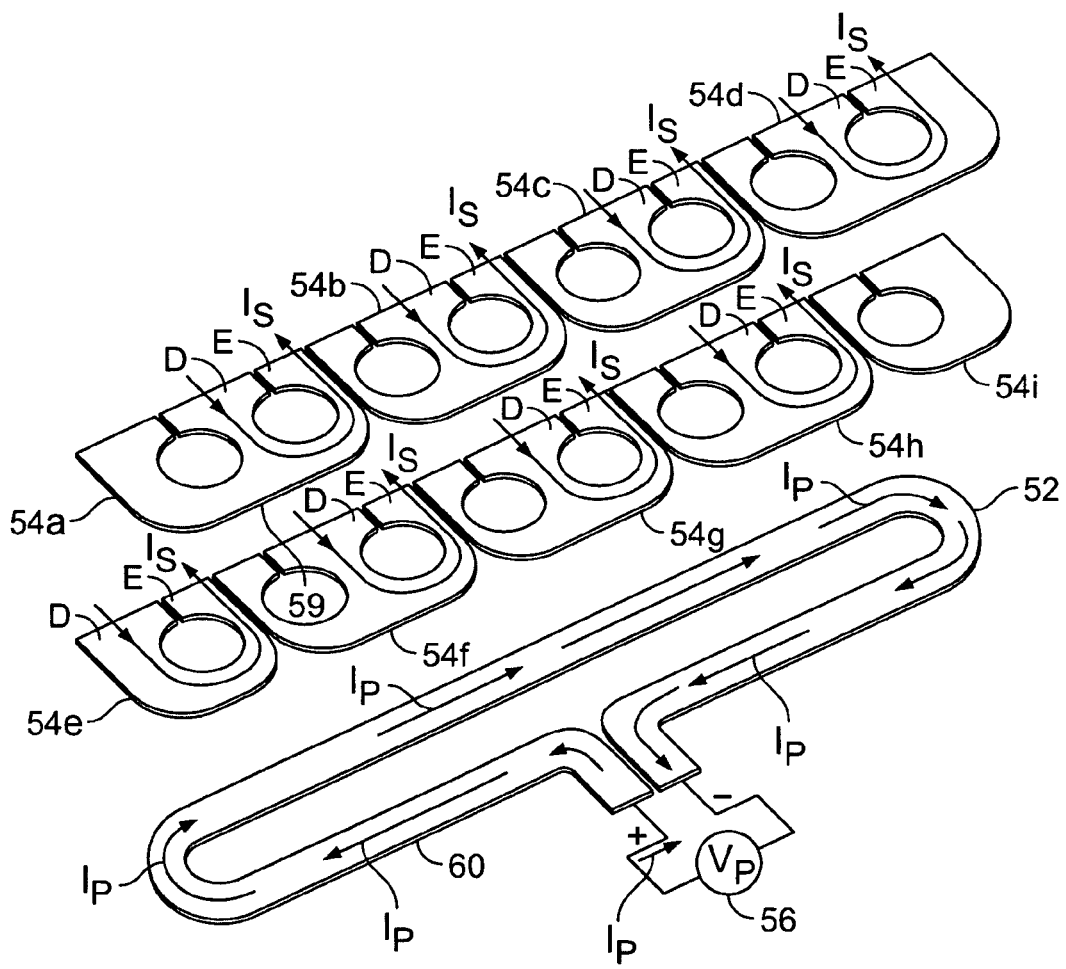
FIG. 8 shows an exploded schematic view of currents flowing in the transformer of FIG. 6.

FIG. 7 shows a schematic of the transformer of FIG. 7 connected in a full-wave rectifier circuit comprising rectifiers 57, 58 (which may be diodes or synchronous rectifiers comprising switches (not shown)). FIG. 8 shows currents flowing in the windings when the secondaries are wired as shown in FIG. 7 and the primary excitation is such that rectifier 58, connected to the points marked "E" is conducting. Under this circumstance, all of the secondary currents, Is, are nominally equal to each other and to the primary current Ip, resulting in a total secondary current equal to 8*Is. With the windings arranged as shown, the flow of currents in the winding overlap in a way that reduces leakage flux. For example, the current flowing into terminal "D" of winding 54a overlaps an equal current flowing in the opposite direction out of terminal "E" of winding 54e; the current flowing along the rear portion 59 of winding 54a overlaps an equal current flowing in the opposite direction in the left rear leg 60 of the primary winding 52; and the current flowing into terminal "D" of winding 54f overlaps an equal current flowing in the opposite direction out of terminal "E" of winding 54a. Likewise, opposing and overlapping currents flow in all of the remaining windings. The relative directions and locations of the currents flowing in the windings and the "eddy current" shielding characteristic of the overlapping windings results in a substantial reduction in leakage flux and leakage inductance.

Figure 9:
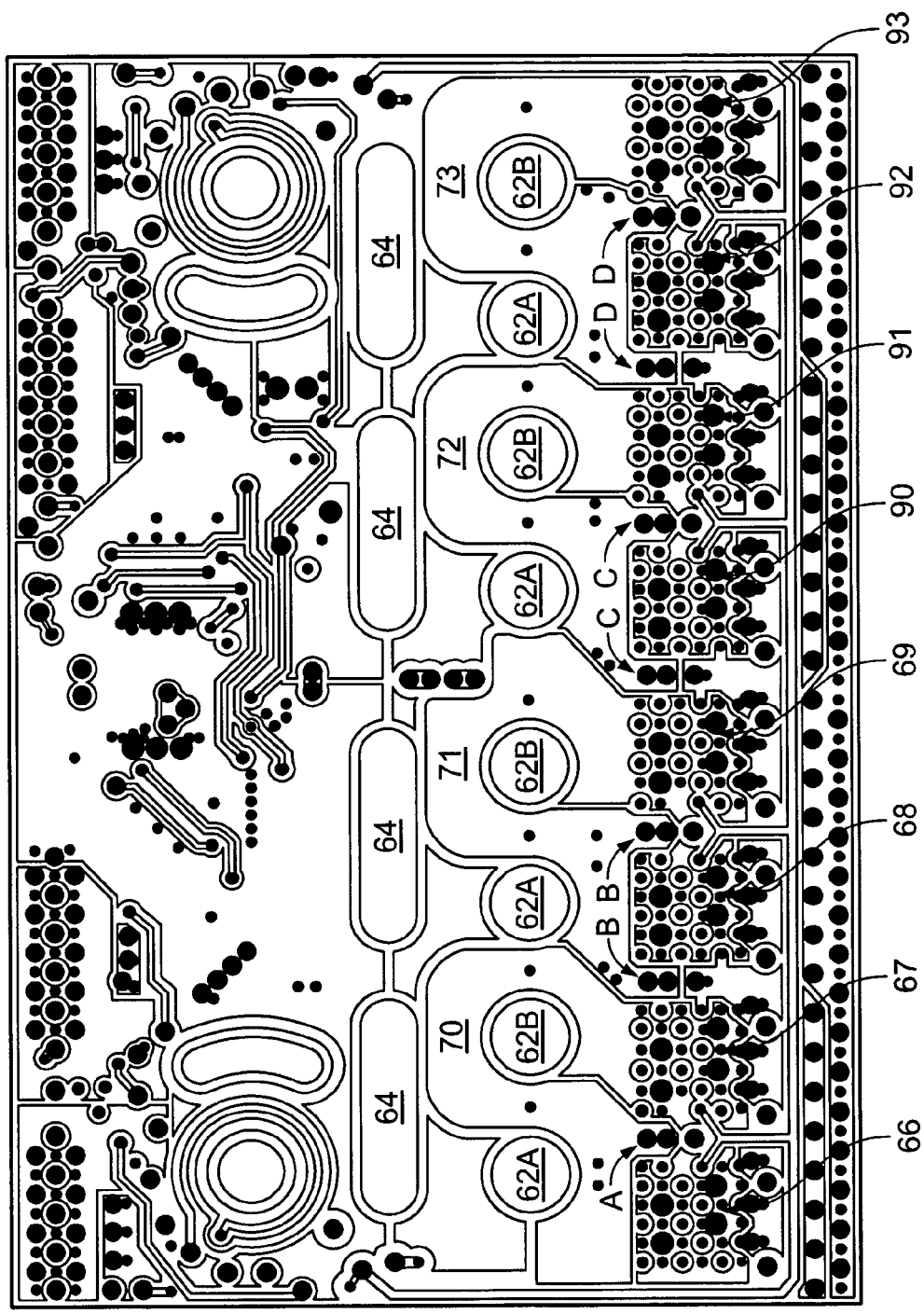
FIGS. 9 through 21 show metal etch layers comprising windings for a transformer.
Figure 10:
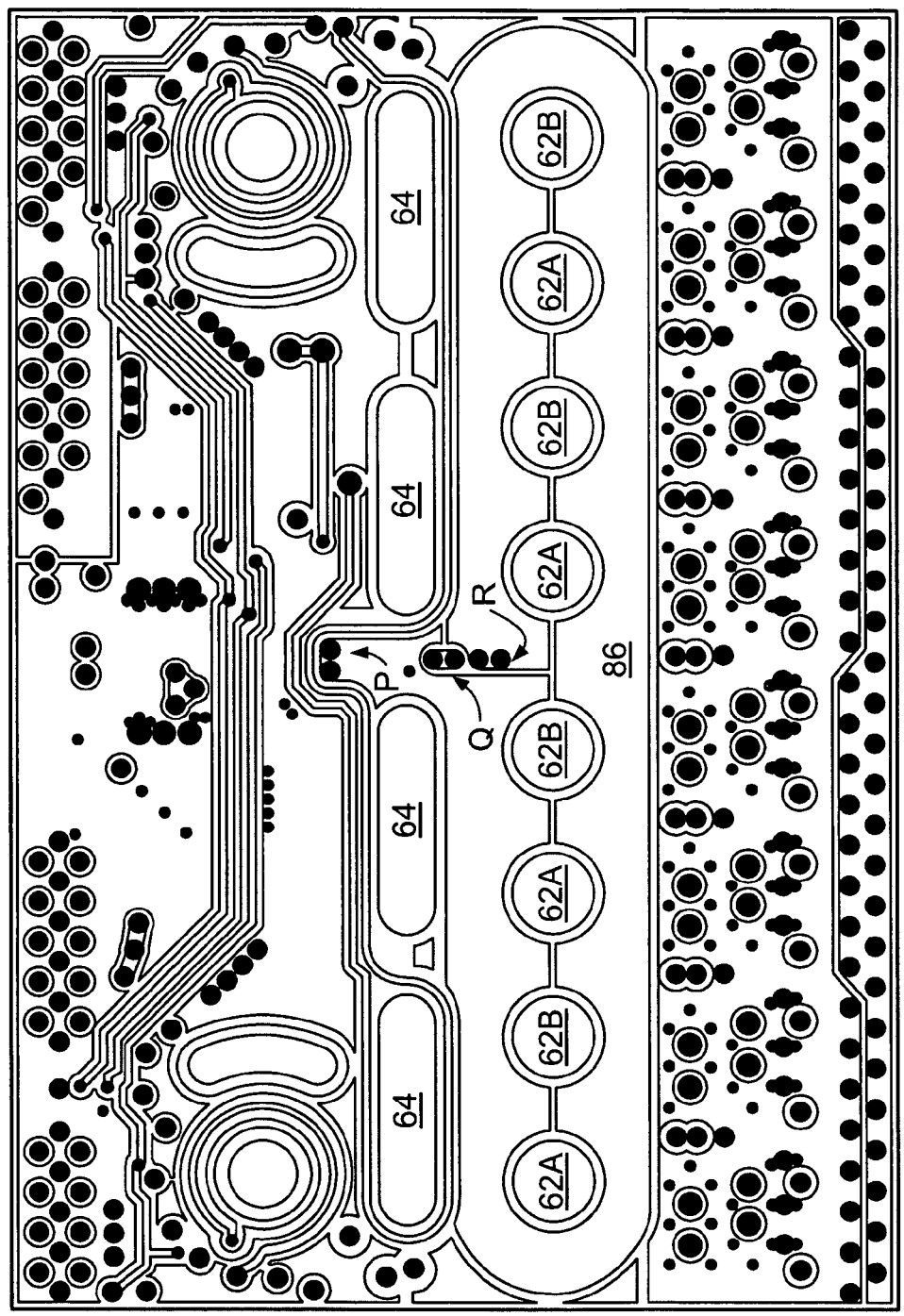
Figure 11:
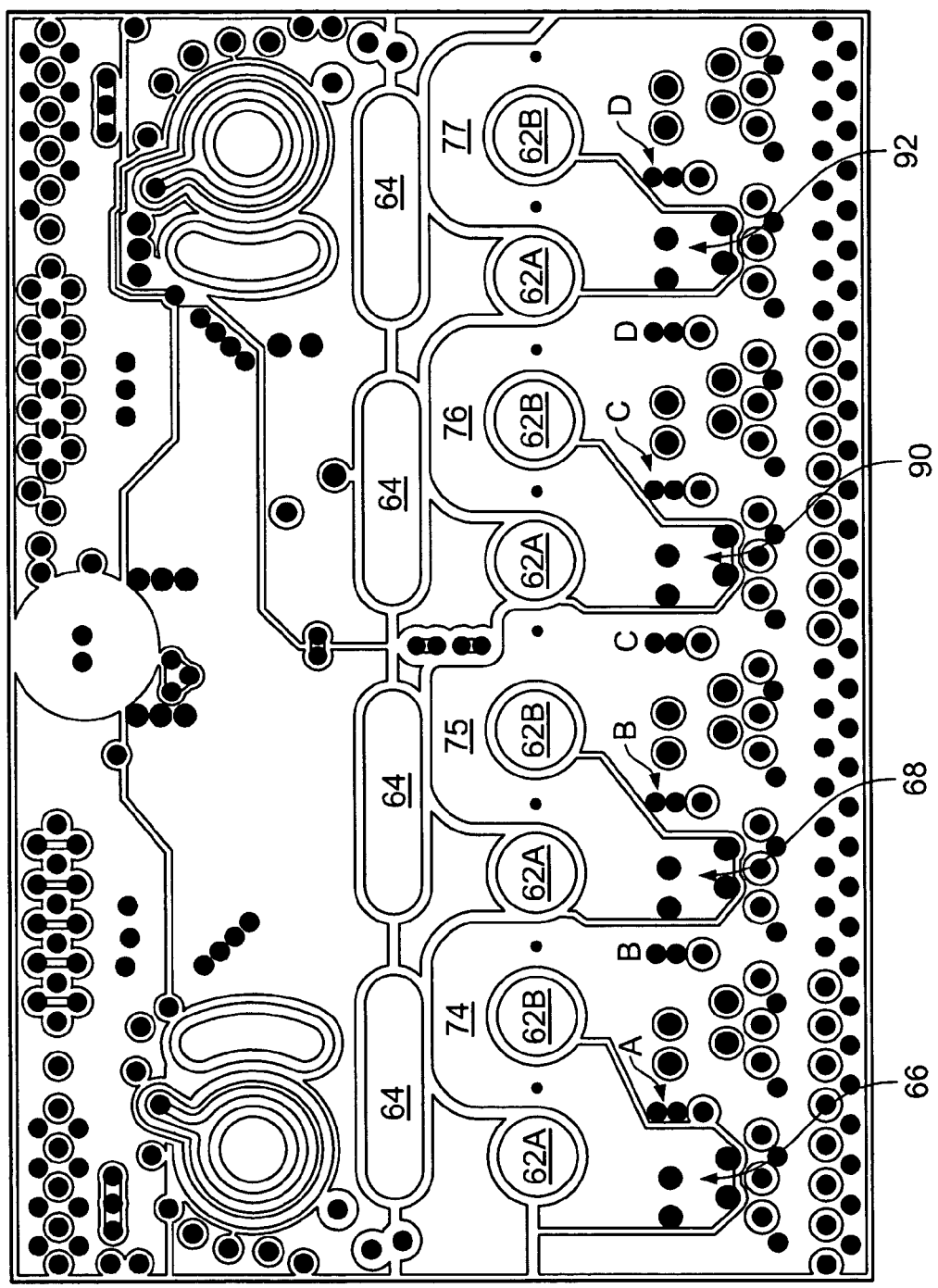
Figure 12:
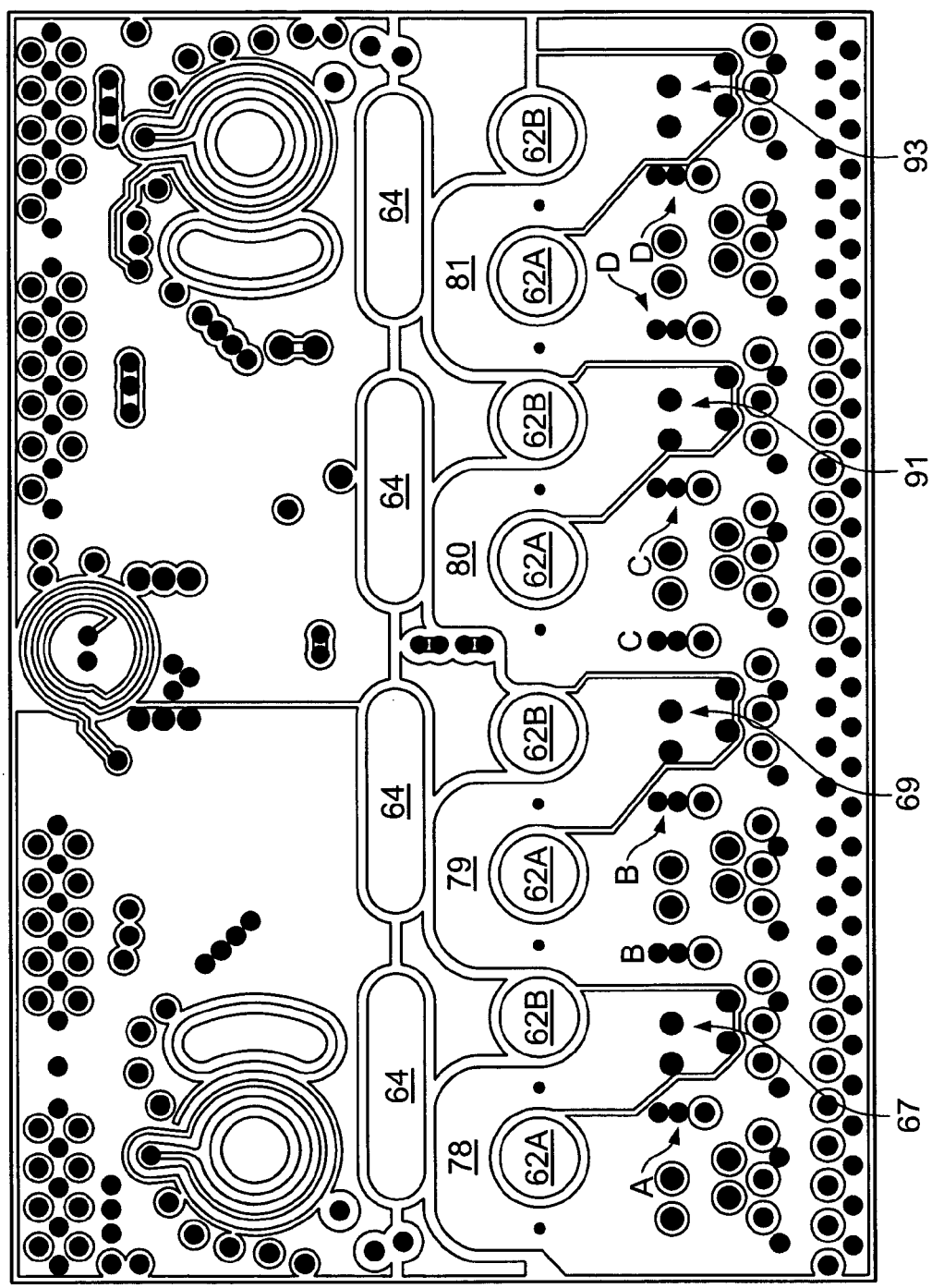
Figure 14:
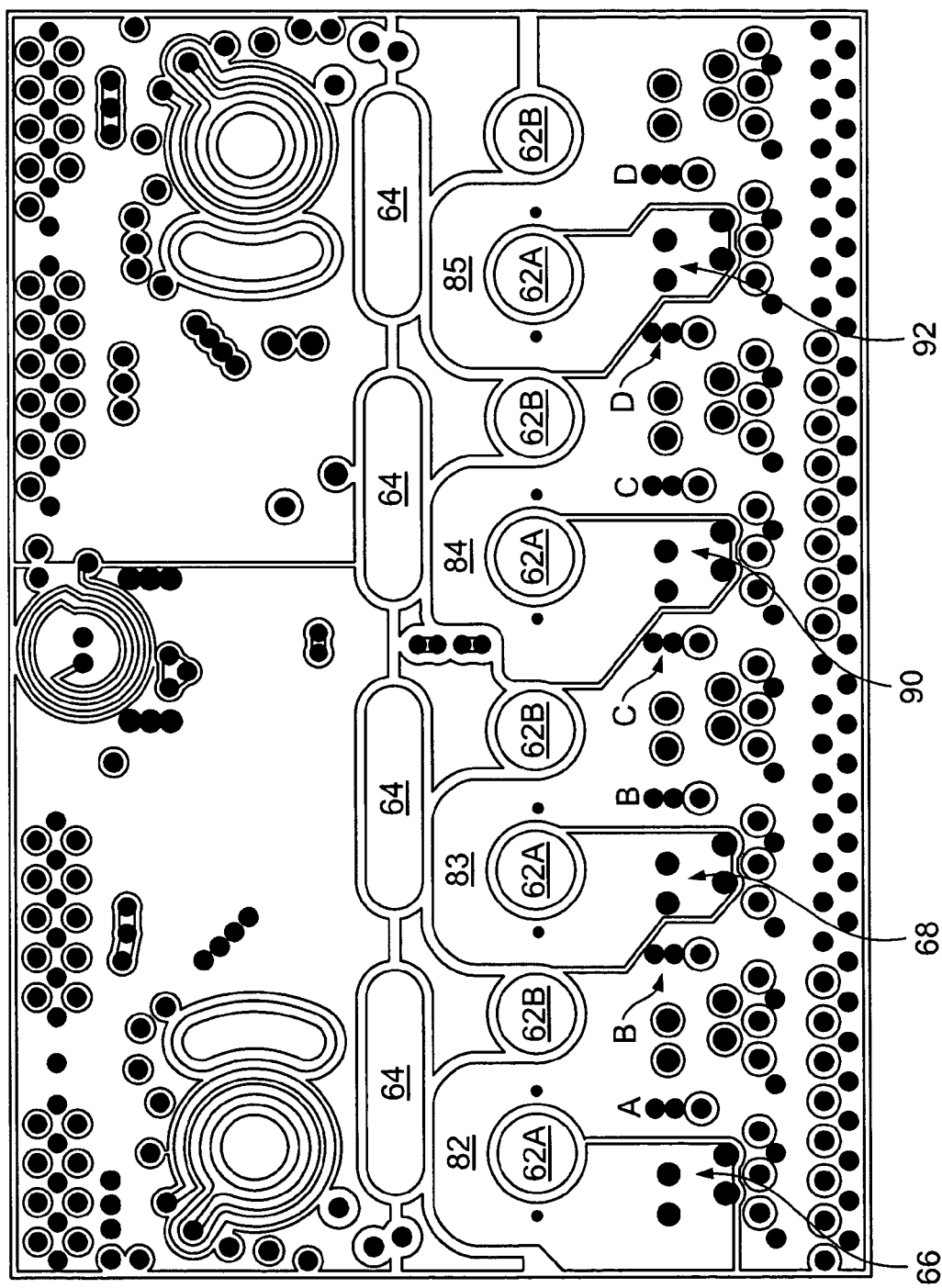
Figure 15:
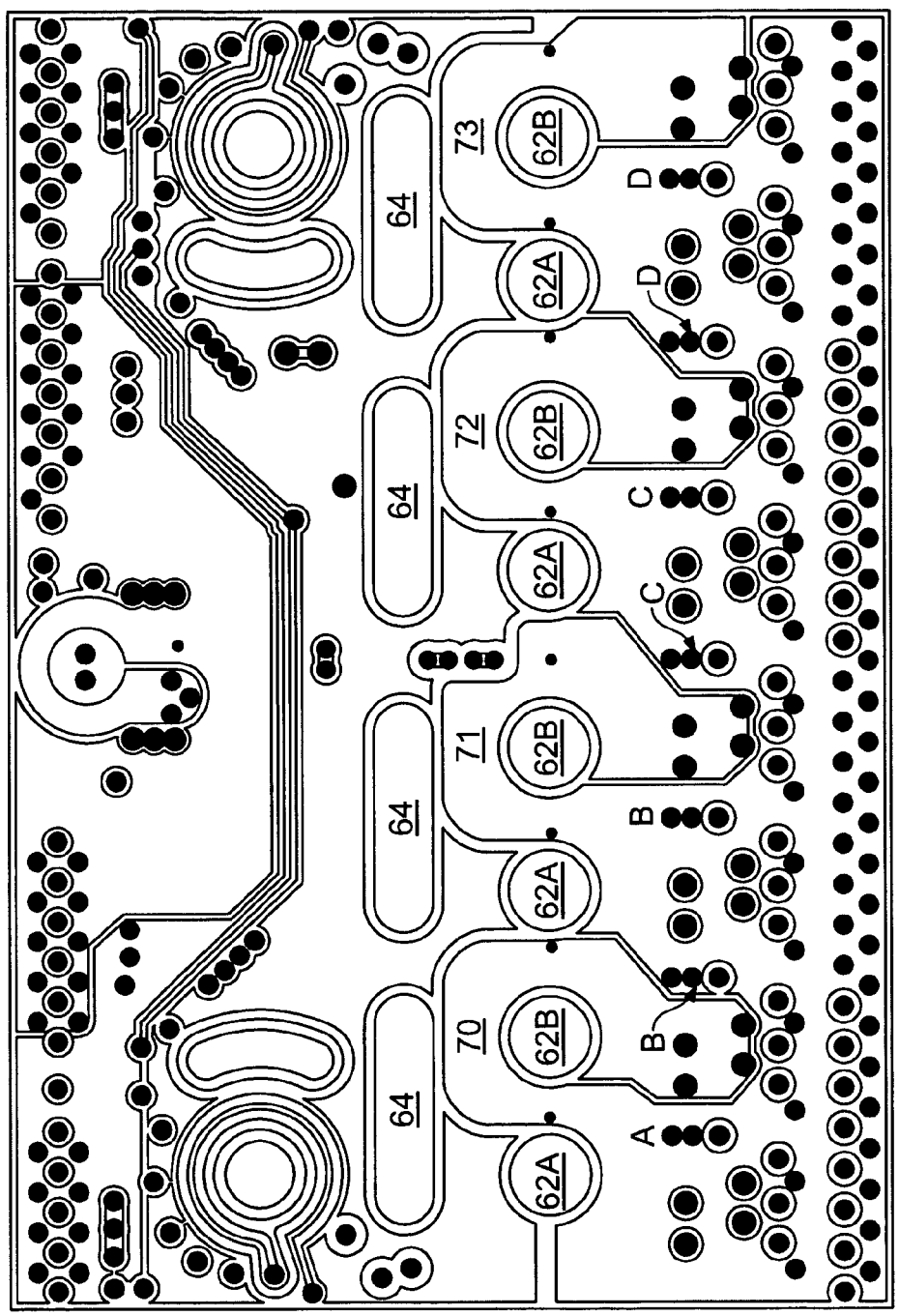
Figure 17:
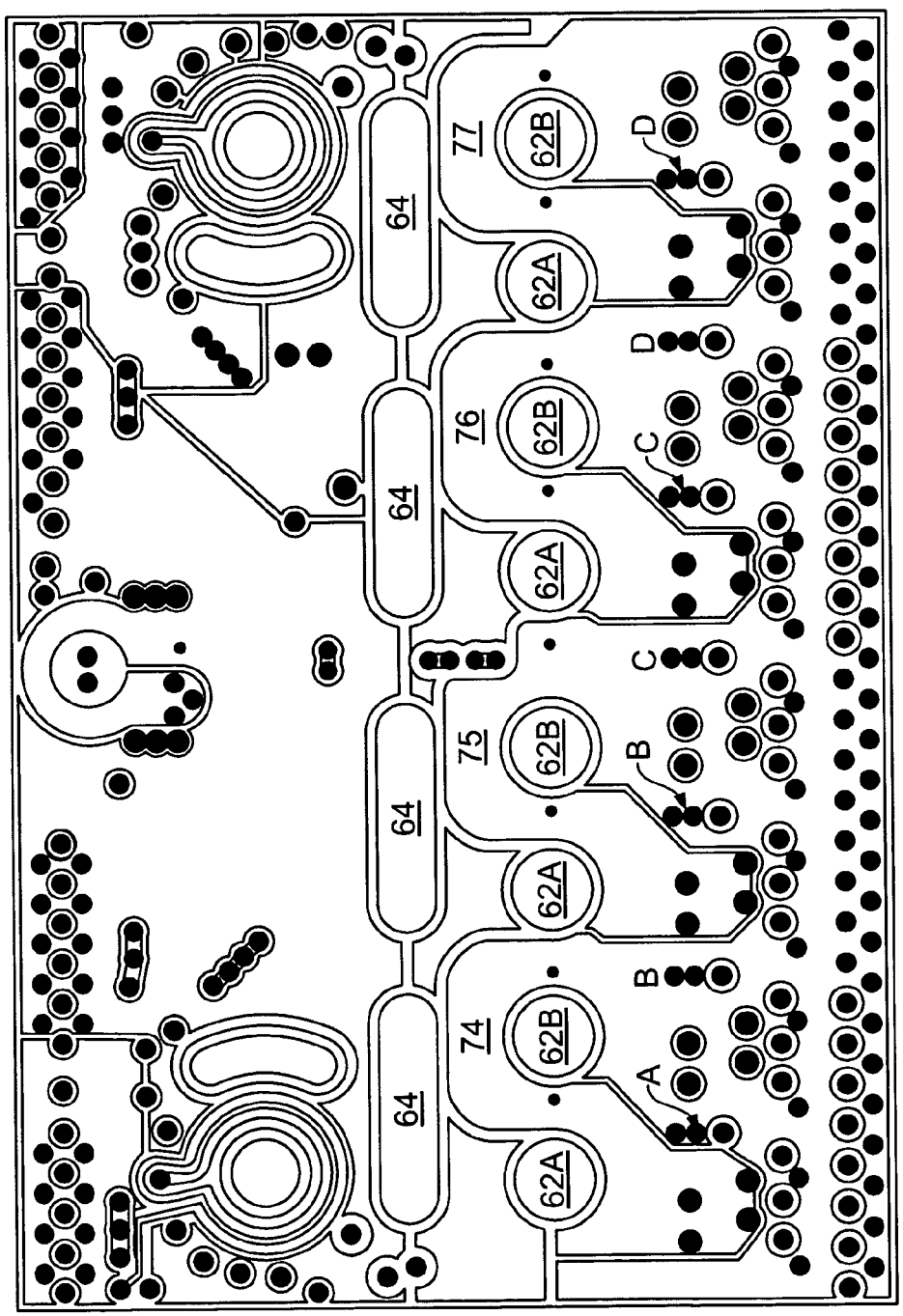
Figure 18:
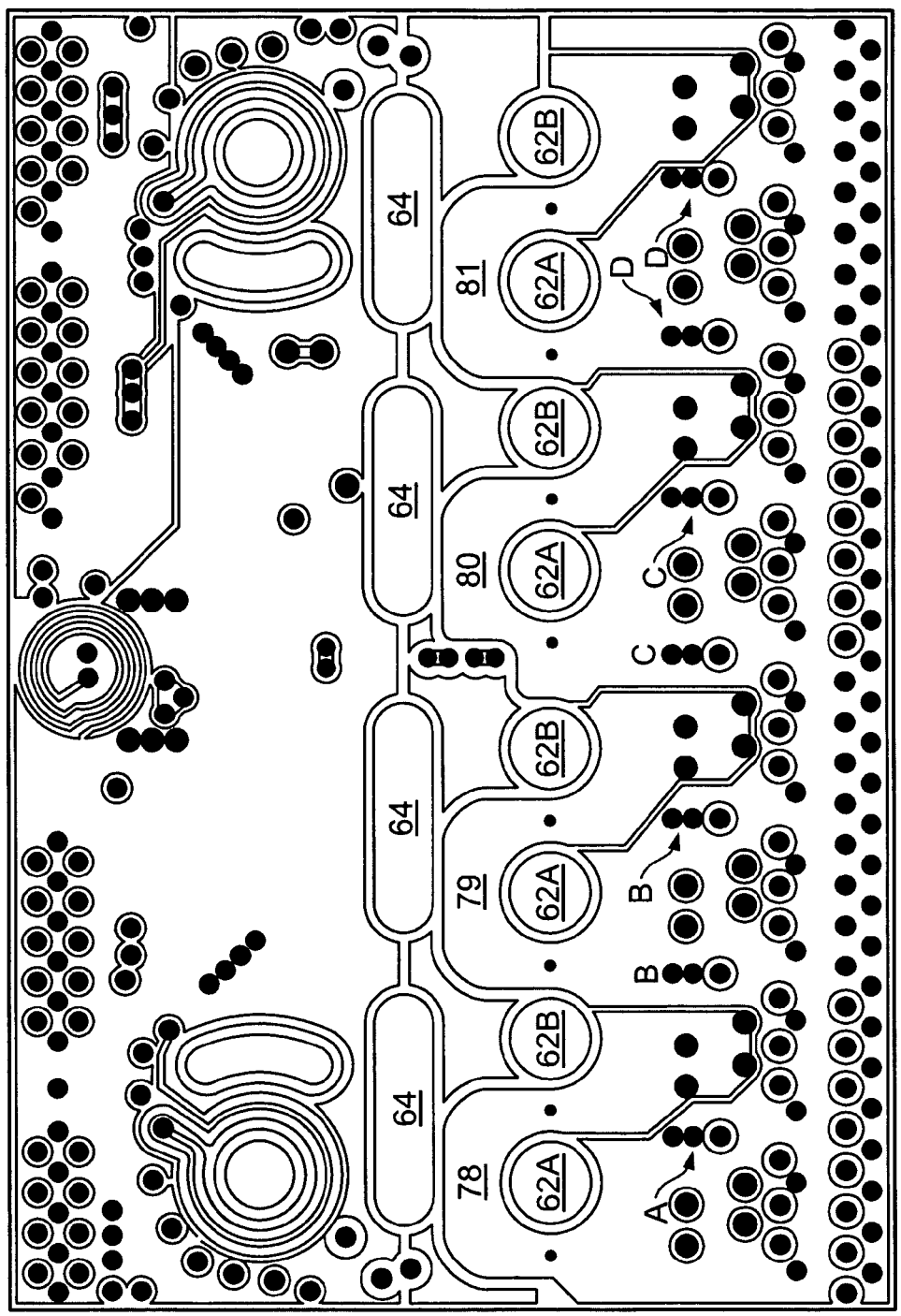
Figure 19:
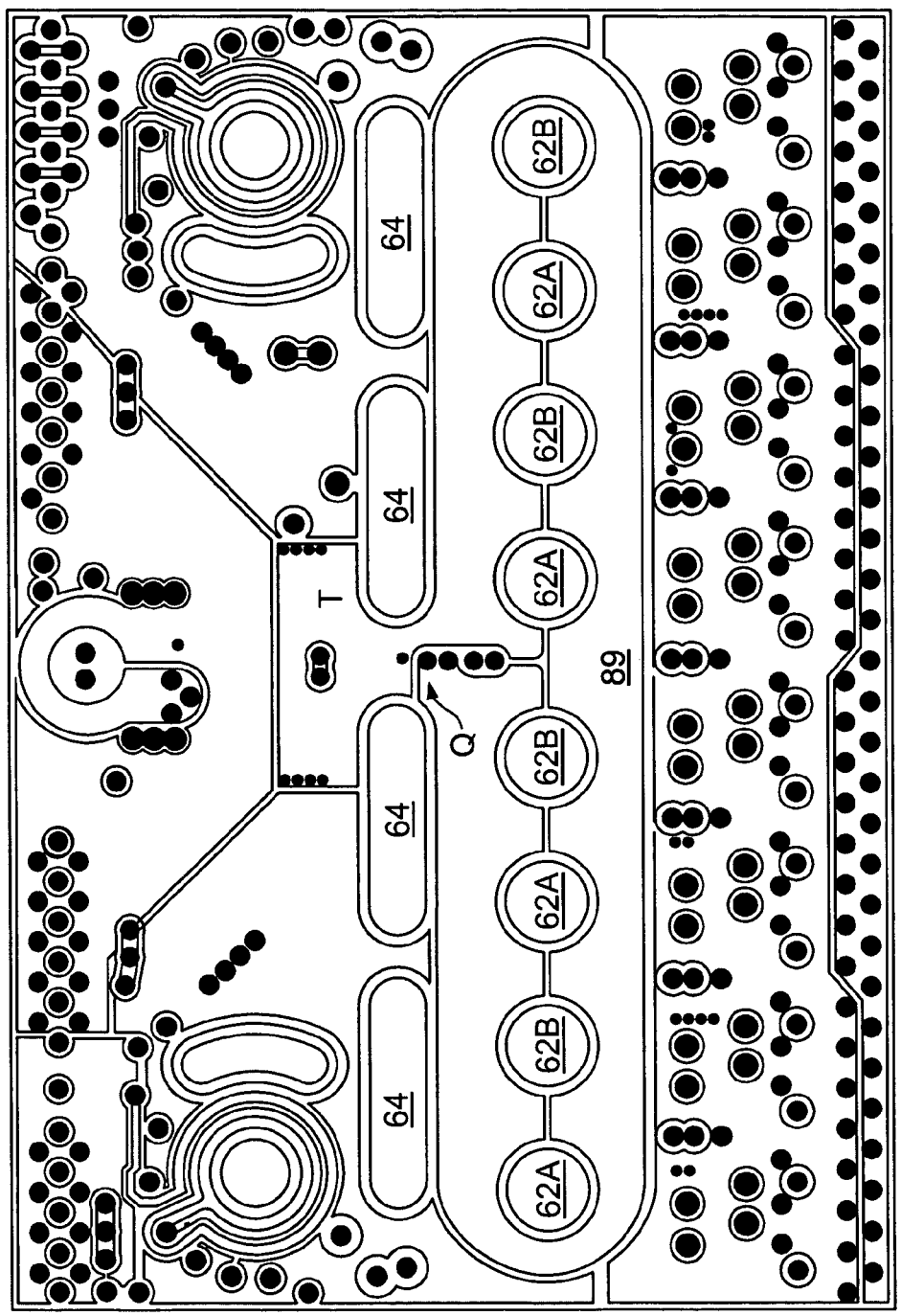
Figure 20:
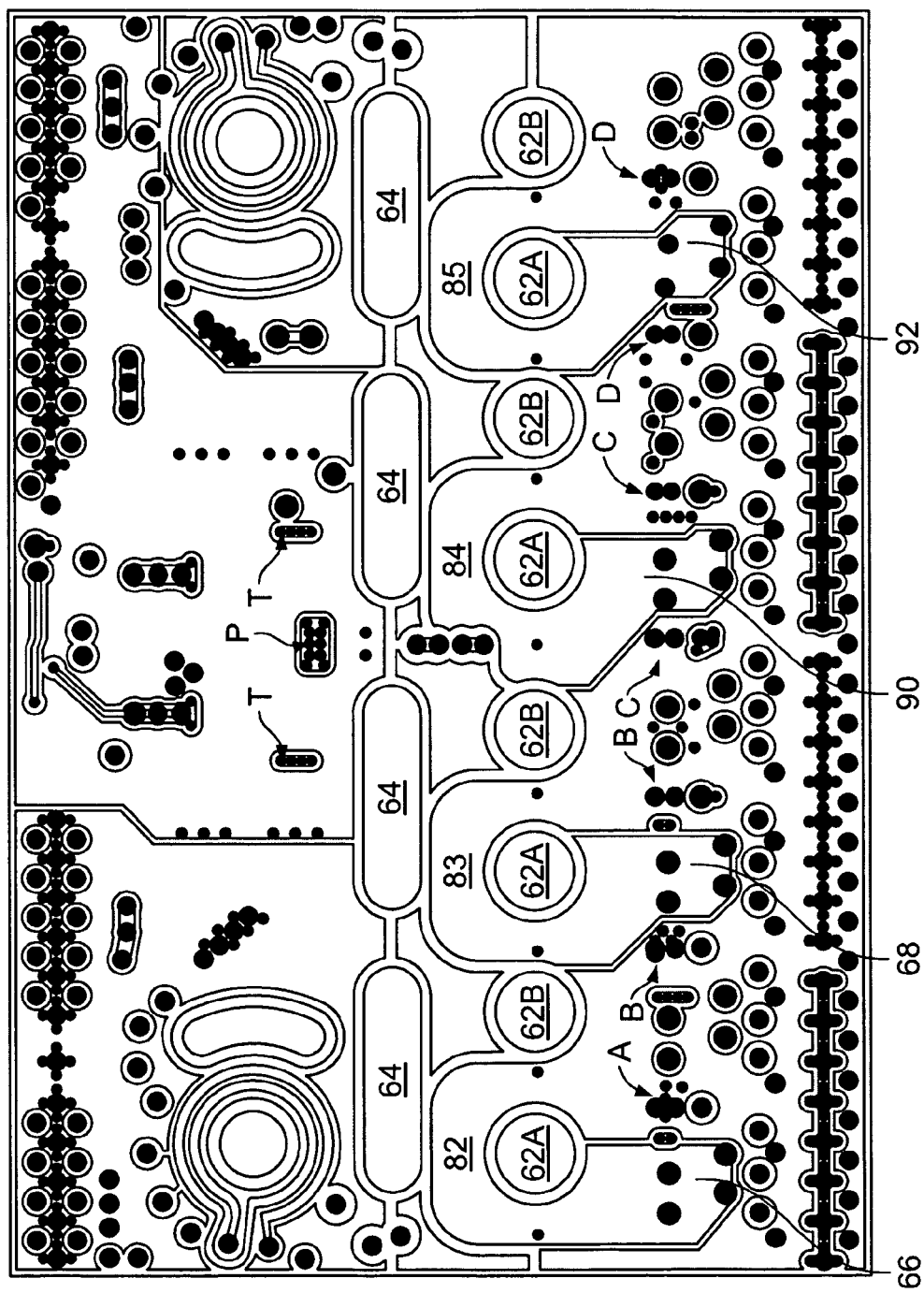

FIGS. 9 through 21 show thirteen etch layers of a printed circuit board comprising primary and secondary windings that form part of a transformer. The printed circuit board is designed for use with four sets of core pairs of the kind shown in FIG. 6, each pair comprising a top core piece 48 and a bottom core piece 50. As illustrated in FIGS. 9–21, holes 62a, 62b in the printed circuit board accommodate narrow legs 61a, 61b (FIG. 6) and slots 64 accommodate wide legs 63. The etch layers in FIGS. 9 and 15 comprise essentially identical sets of four secondary windings 70, 71, 72, 73 each winding in each layer being connected to its numerical counterpart in the other layer by means of the via connections between the layers (e.g., via connections marked "A", "B", "C", and "D"). The etch layers in FIGS. 11 and 17 comprise essentially identical sets of four secondary windings 74, 75, 76, 77 each winding in each layer being connected to its numerical counterpart in the other layer by means of the via connections between the layers (e.g., via connections 66, 68, 90, 92 and those marked "A", "B", "C", and "D"). The etch layers in FIGS. 12 and 18 comprise essentially identical sets of four secondary windings 78, 79, 80, 81 each winding in each layer being connected to its numerical counterpart in the other layer by means of the via connections between the layers (e.g., via connections 67, 69, 91, 93 and those marked "A", "B", "C", and "D"). The etch layers in FIGS. 14 and 20 comprise essentially identical sets of four secondary windings 82, 83, 84, 85 each winding in each layer being connected to its numerical counterpart in the other layer by means of the via connections between the layers (e.g., via connections 66, 68, 90, 92 and those marked "A", "B", "C", and "D").

Figure 21:
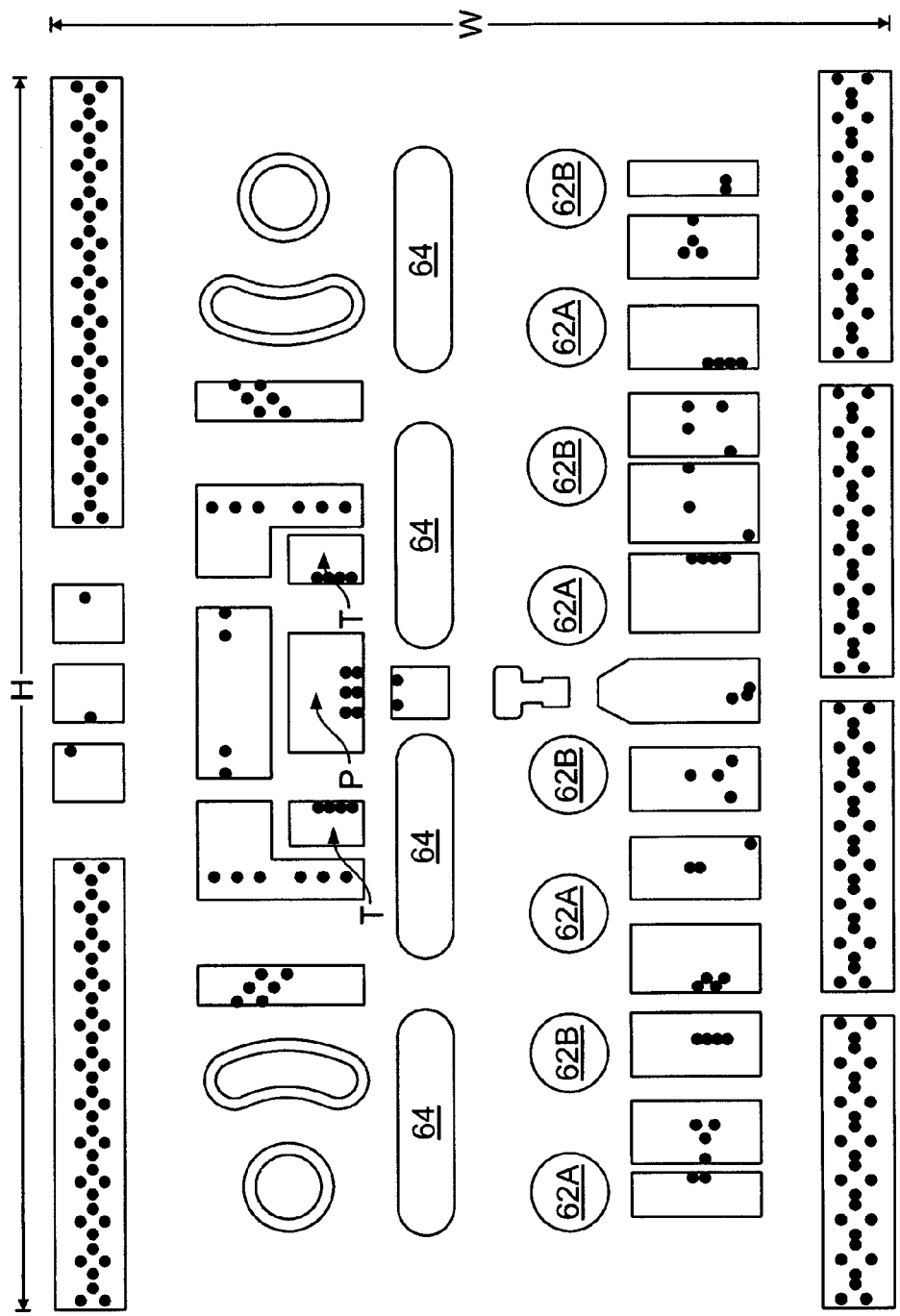
Figure 22:
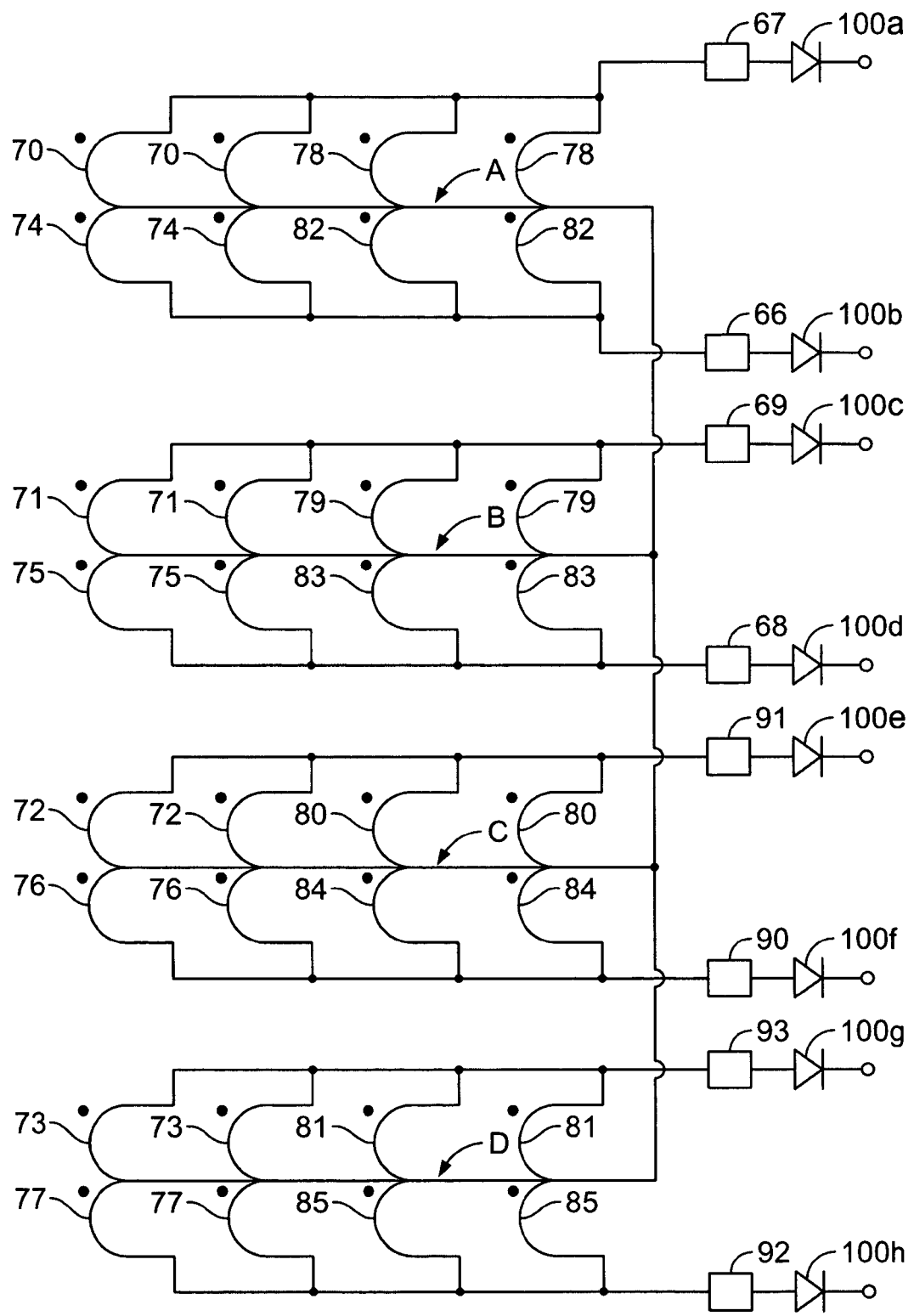
FIG. 22 is a schematic diagram of interconnections of windings.

Secondary windings 70 through 77 surround holes 62b and are linked by flux in core legs 61b; secondary windings 78 through 85 surround holes 62a and are linked by flux in core legs 61a. All of the locations connected by vias having the same numerical designator are connected together. Thus, e.g., windings 70 are connected in parallel with each other and with the two windings 78 (FIGS. 12 and 18) by means of vias "A" and via connections 67. The vias numbered 66–69 and 90–93 in FIG. 9 connect to pad locations having the same numeric designators in FIGS. 10–20. The latter pad locations (66–69; 90–93, FIG. 9) are brought out to another layer (not shown) for connection to ball-grid arrays of contacts on synchronous rectifier switches (not shown). A schematic of the connections between all of the thirty-two secondary windings (two each of secondaries 70–85) of FIGS. 9 through 21, along with their corresponding pad locations, via interconnection designators and synchronous rectifiers (shown as diodes 100a–100h), is shown in FIG. 22. The polarity dot on each winding reflects the relative polarity of the winding voltage for the same polarity of flux in each of the legs 61a, 61b and corresponding holes 62a, 62b.

Figure 13:
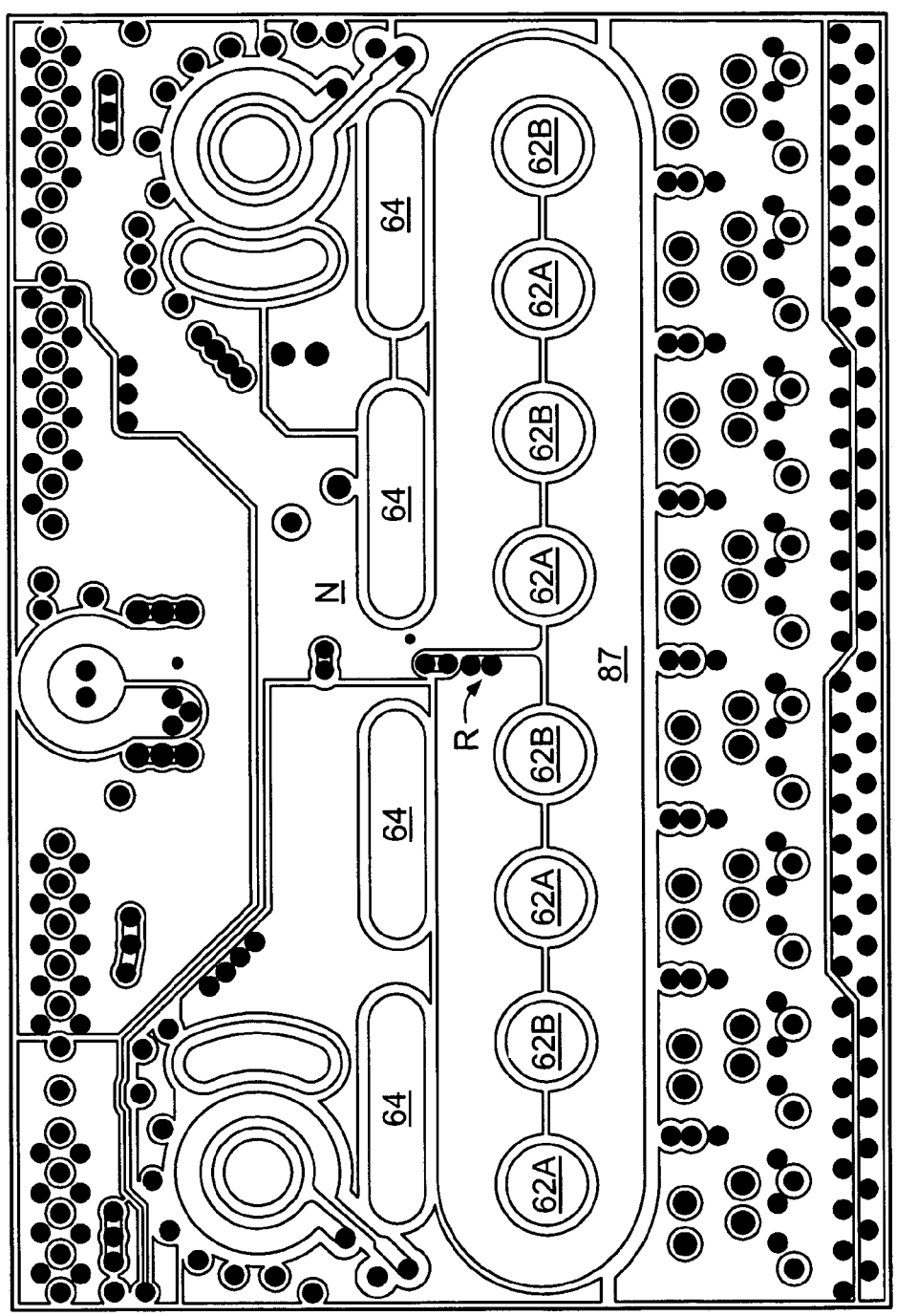
Figure 16:
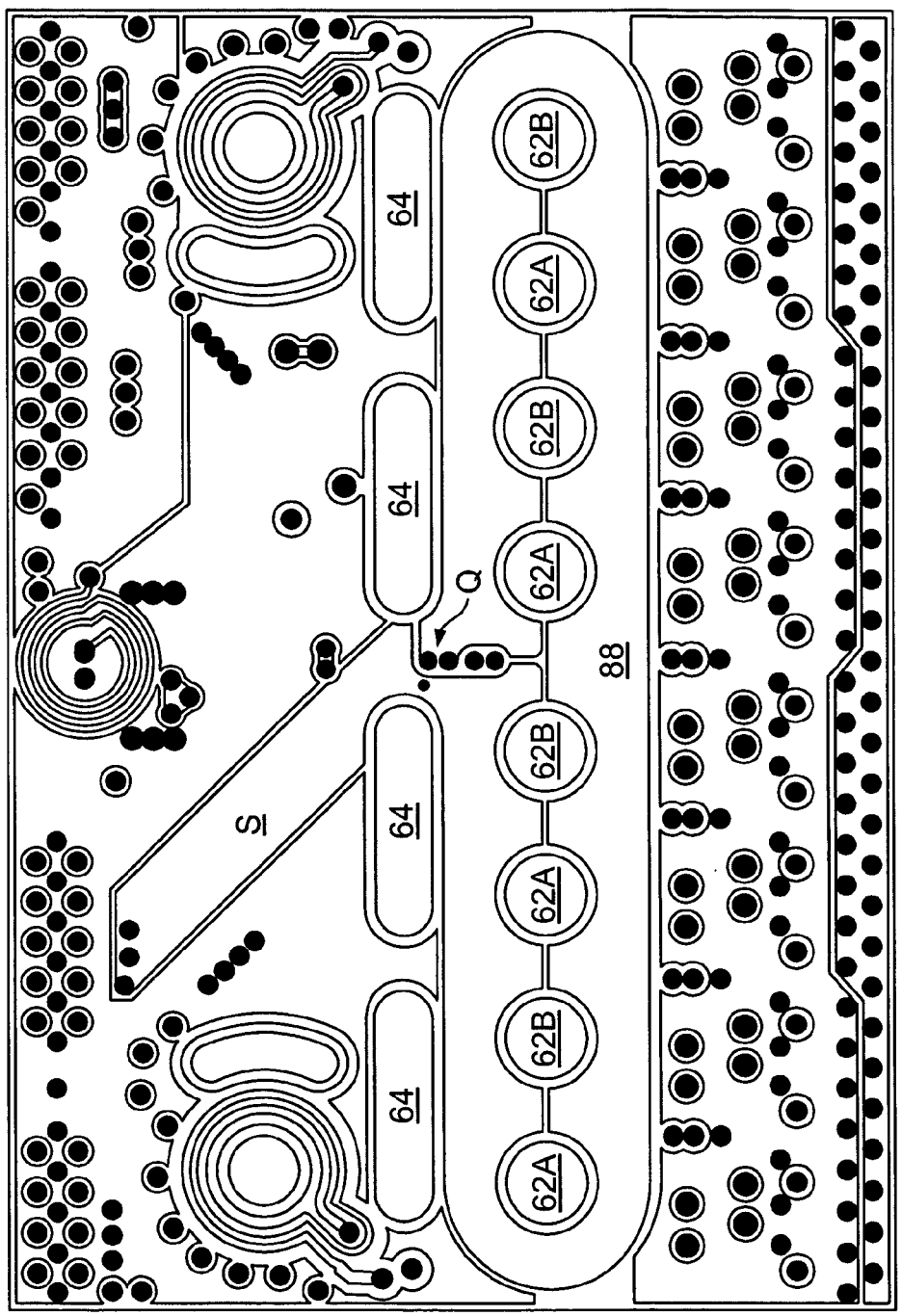
Figure 23:
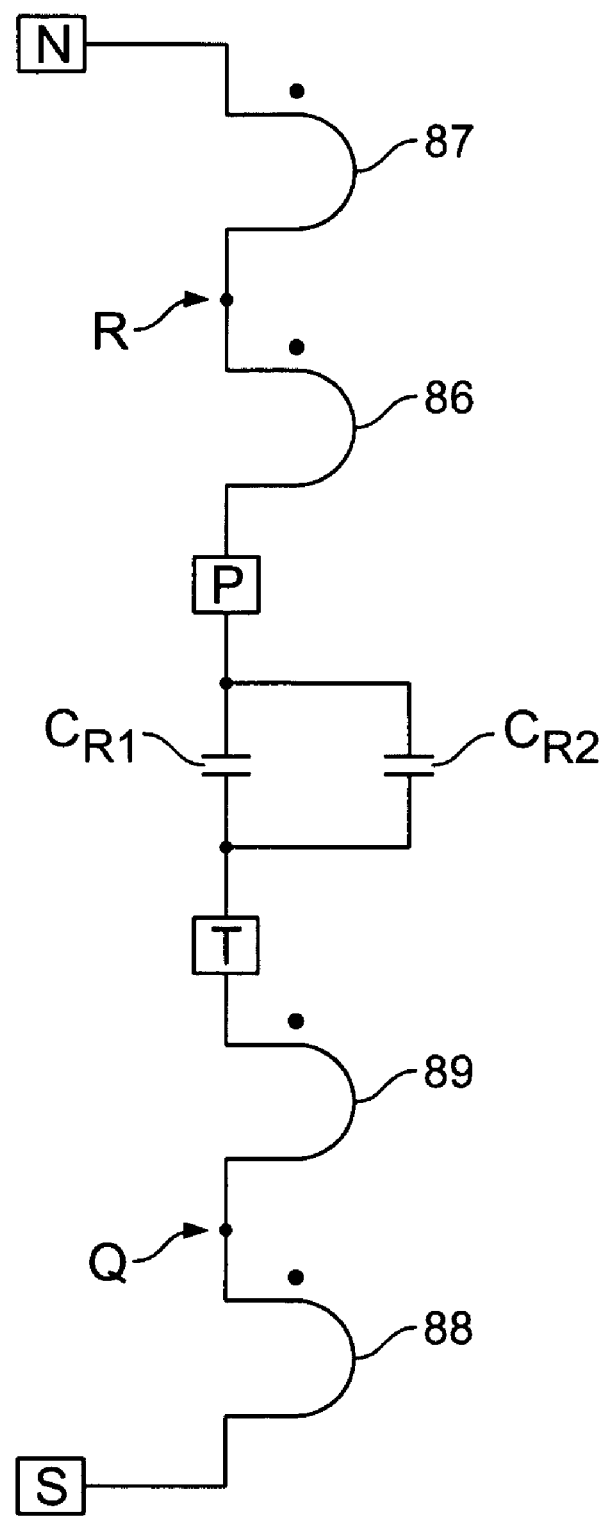
FIG. 23 is a diagram of circuit connections.

FIGS. 10, 13, 16 and 19 show etch layers comprising primary windings 86, 87, 88 and 89. Each primary winding passes through all four core pairs and current flowing in a winding induces essentially equal amounts of flux in each core pair. The regions mark "N" and "S" in, respectively, FIGS. 13 and 16, represent the ends of the complete primary winding. Region "N", in FIG. 13, connects to one end of winding 87; the other end of winding 87 connects to an end of winding 86 (FIG. 10) by means of vias "R"; the other end of winding 86 connects to vias "P" which connects to the pad marked "P", in FIG. 21. Region "S", in FIG. 16, connects to one end of winding 88; the other end of winding 88 connects to an end of winding 89 (FIG. 19) by means of vias "Q"; the other end of winding 89 connects to vias "T" which connects to the pads marked "T" in FIG. 21. In FIG. 21 the pads "P" and "T" are surface-mount pads for connection of two resonant capacitors (not shown). One such capacitor is connected between a pad "T" and pad "P" and another capacitor is connected between the other pad "T" and pad "P." By this means the two capacitors are connected in parallel with each other and in series with all of the windings. A schematic of the connections between the four primary windings (86–89) of FIGS. 10, 13, 16 and 19, along with their corresponding pad locations, via interconnection designators and resonant capacitors (marked $C_{R1}$ and $C_{R2}$ in the Figure), is shown in FIG. 23. The polarity dot on each winding reflects the relative polarity of the winding voltage for the same polarity of flux in each of the legs 61a, 61b and corresponding holes 62a, 62b.

With the secondary and primary windings configured as described above in FIGS. 9 through 23, and assuming that all of the cathodes of the synchronous rectifiers (100a–100h, FIG. 22) are connected together, the primary-to-secondary turns ratio of the transformer will be 32:1.

An example of the transformer of FIGS. 9 through 23 comprises a fourteen layer PCB. Each layer in the PCB is of nominal dimensions H=1.26 inches (32 mm) and W=0.85 inch (21.5 mm), where H and W are shown in FIG. 21. In the remainder of this paragraph, numerical references of "etch layers" will correspond to the Figure in which the etch layer is shown (e.g. "etch layer 9" refers to the etch layer corresponding that shown in FIG. 9). Etch layers 9, 20 and 21 comprise 1.5 ounce copper etch; etch layers 10 through 19 comprise 2 ounce copper etch. Etch layers 9 and 10 and etch layers 19 and 20 are separated by 0.0041 inch (0.103 mm); etch layers 20 and 21 are separated by 0.0043 inch (0.109 mm); etch layers 10 and 11, etch layers 12 and 13, etch layers 14 and 15, etch layers 16 and 17 and etch layers 18 and 19 are separated by 0.0035 inch (0.089 mm); etch layers 11 and 12, etch layers 13 and 14, etch layers 15 and 16 and etch layers 17 and 18 are separated by 0.0044 inch (0.110 mm). In all cases the separation medium comprises Nelco 13 substrate material, manufactured by Park Industries, Anaheim, Calif., USA. At a frequency of 1.5 Megahertz, the described transformer has a primary-referenced leakage inductance of 165 nanohenries and a primary-referenced equivalent resistance of 0.57 ohm; at a frequency of 0.5 Megahertz, the described transformer has a primary-referenced leakage inductance of 182 nanohenries and a primary-referenced equivalent resistance of 0.44 ohm.

Other implementations are within the scope of the following claims. For example, the numbers of primaries and secondaries, their configurations, the relationships between them, the configurations of the substrates on which they are formed, and other aspects of the transformer can vary from the examples given.

What is claimed is:

1. An apparatus comprising:
a circuit board having apertures;
separate magnetic flux paths each forming a closed loop that passes through at least one of the apertures and surrounds an interior space, the flux paths including portions that lie within magnetically permeable core pieces, at least two of the flux paths being oriented so that there is a straight line in the circuit board that passes through the interior spaces of the at least two flux paths without passing through any of the apertures that are included in the paths,
an electrically conductive primary winding having a first segment that passes through the interior spaces of the flux paths and a second segment located outside of the interior spaces; and
two or more electrically conductive secondary windings.

2. The apparatus of claim 1 in which the two flux paths are adjacent on the board.

3. The apparatus of claim 1 in which the primary winding comprises a loop.

4. The apparatus of claim 3 in which the loop comprises two longer parallel straight segments and two shorter bridging segments that connect the two longer parallel straight segments.

5. The apparatus of claim 3 in which at least one of the secondary windings is on a second layer of the circuit board.

6. The apparatus of claim 1 in which each of the secondary windings comprises a first segment that passes through fewer interior spaces than does the primary winding.

7. The apparatus of claim 1 in which each of the secondary windings comprises a first segment that overlays the first segment of the primary winding and a second segment that overlays the second segment of the primary winding.

8. The apparatus of claim 1 in which the flux path comprises no gaps between permeable core pieces.

9. The apparatus of claim 1 in which the flux path comprises gaps between permeable core pieces.

10. The apparatus of claim 1 in which the magnetically permeable core pieces include flat pieces and pieces with legs.

11. The apparatus of claim 1 in which at least two of the secondary windings are connected in parallel.

12. The apparatus of claim 1 in which connections to the primary winding are made along an edge of the circuit board that is on a different side of the apparatus from an edge along which connections are made to at least one of the secondary windings.

13. The apparatus of claim 1 in which the core pieces include flat pieces and pieces that each have one leg on one side of an interior space and two legs on another side of the interior space.

14. The apparatus of claim 1 in which the secondary windings are connected to form a single center-tapped winding.

15. The apparatus of claim 1 in which the secondary windings lie on two different layers of the board.

16. The apparatus of claim 1 in which the secondary windings are configured to produce different turns ratios.

17. An apparatus comprising:

a circuit board having apertures;

separate magnetic flux paths each forming a closed loop that passes through at least one of the apertures and surrounds an interior space, the flux paths comprising portions that lie within magnetically permeable core pieces, at least two adjacent ones of the flux paths being oriented so that there is a straight line in the circuit board that passes through the interior spaces of the at least two adjacent flux paths without passing through any of the apertures that are included in the paths, an electrically conductive primary winding in the form of a loop having a first segment that passes through the interior spaces of the flux paths and a second segment located outside of the interior spaces; and two or more electrically conductive secondary windings on at least a second layer of the circuit board, each of the secondary windings comprising a first segment that overlays the first segment of the primary winding and passes through fewer interior spaces than does the primary winding, and a second segment that overlays the second segment of the primary winding, at least two of the secondary windings being connected in parallel, connections to the primary winding being made along an edge of the circuit board that is on a different side of the apparatus from an edge along which connections are made to at least one of the secondary windings.

18. The apparatus of claim 17 in which the secondary windings are connected to form a single center-tapped winding.

19. The apparatus of claim 17 in which the secondary windings lie on two different layers of the board.

20. The apparatus of claim 17 in which the secondary windings are configured to produce different turns ratios.

21. A circuit comprising:

electrical elements forming a series-resonant full-bridge converter, the elements including a transformer comprising a circuit board having apertures;

separate magnetic flux paths each forming a closed loop that passes through at least one of the apertures and surrounds an interior space, the flux paths comprising portions that lie within magnetically permeable core pieces, at least two of the flux paths being oriented so that there is a straight line in the circuit board that passes through the interior spaces of the at least two flux paths without passing through any of the apertures that are included in the paths, an electrically conductive primary winding having a first segment that passes through the interior spaces of the flux paths and a second segment located outside of the interior spaces; and two or more electrically conductive secondary windings.

* * * * *